United States Patent
Yoshikawa et al.

[11] Patent Number: 5,163,063
[45] Date of Patent: Nov. 10, 1992

[54] SEMICONDUCTOR LASER DRIVING CIRCUIT

[75] Inventors: Yukio Yoshikawa; Takeshi Ishii; Yoshihiro Oyama; Tatsuo Sasaki; Tamotsu Takahashi, all of Tokyo; Shinichi Sato, Kawasaki; Kazumasa Moriya, Kawasaki; Ichiro Shinoda, Kawasaki; Motohiko Itoh, Kawasaki; Tomoyuki Kashiwazaki, Kawasaki; Hiroaki Kawai, Kawasaki; Mitsuo Watanabe, Kawasaki, all of Japan

[73] Assignees: Copal Co., Ltd.; Fujitsu Limited, both of Japan

[21] Appl. No.: 650,422

[22] Filed: Feb. 4, 1991

[30] Foreign Application Priority Data

| Feb. 7, 1990 | [JP] | Japan | 2-29098 |
| Feb. 7, 1990 | [JP] | Japan | 2-29099 |
| Feb. 7, 1990 | [JP] | Japan | 2-29100 |
| Feb. 7, 1990 | [JP] | Japan | 2-29101 |
| Feb. 7, 1990 | [JP] | Japan | 2-29102 |
| Feb. 7, 1990 | [JP] | Japan | 2-29103 |
| Apr. 27, 1990 | [JP] | Japan | 2-113660 |

[51] Int. Cl.$^5$ .............................. H01S 3/04
[52] U.S. Cl. .............................. 372/38; 372/29; 372/31
[58] Field of Search .............................. 372/31, 29, 38

[56] References Cited

U.S. PATENT DOCUMENTS

| 4,751,743 | 6/1988 | Ishino | 382/59 |
| 4,924,473 | 5/1990 | Burgyan et al. | 372/38 |
| 4,955,029 | 9/1990 | Lecoy et al. | 372/31 |
| 5,018,155 | 5/1991 | Miyari | 372/31 |

FOREIGN PATENT DOCUMENTS

| 0083452 | 12/1982 | European Pat. Off. . |
| 0248646 | 3/1987 | European Pat. Off. . |
| 0296427 | 6/1988 | European Pat. Off. . |
| 2214958 | 3/1972 | Fed. Rep. of Germany . |
| 3043386 | 7/1988 | Japan . |
| 1236387 | 12/1989 | Japan . |

OTHER PUBLICATIONS

Technical Digest of the European Conference on Optical Communication 1987, vol. 1, pp. 453-456, 1987.

Primary Examiner—Georgia Y. Epps
Attorney, Agent, or Firm—Sixbey, Friedman, Leedom & Ferguson

[57] ABSTRACT

A semiconductor laser driving circuit has a semiconductor laser for emitting a laser beam according to a drive power. A photodetector is provided for effecting photo-electric conversion of the laser beam to output a corresponding electric signal. A monitoring circuit is connected for monitoring the electric signal to output a monitor signal indicative of variation in intensity of the laser beam. A controlling circuit is connected for comparing the monitor signal with a given reference signal to output a control signal according to difference therebetween. A powering circuit is operative according to the control signal to apply to the semiconductor laser a drive power effective to eliminate the difference. An abnormality detecting circuit is provided for comparing the monitor signal with a given limit signal which is set different from the reference signal to detect abnormality to output an abnormality signal.

25 Claims, 26 Drawing Sheets

SEMICONDUCTOR LASER DRIVING CIRCUIT

BACKGROUND OF THE INVENTION

The present invention relates to safety performance of a driving circuit of the semiconductor laser, and more specifically relates to detection of abnormality in the semiconductor laser or in a photodetector utilized for power control of the laser, due to breakdown or degradation thereof. The present invention further relates to detection of lifetime of the semiconductor laser, and to forcible shutdown technology of the semiconductor laser in case of emergency.

Conventionally, the semiconductor laser is utilized as a component of a head of various information instruments such as information reading head of the compact disc player, information reading/writing head of the optical disc memory, bar code reader head provided in the POS terminal device, and print head of the laser beam printer.

The semiconductor laser is the most important component in these various information instruments. When an information instrument is inadvertently operated in spite of the semiconductor laser abnormality due to breakdown or degradation thereof, there may be caused a problem that information processing is not carried out correctly. Particularly, some type of the semiconductor laser emits an invisible light such as ultra-red ray, hence it would be difficult to recognize defect or degradation of the semiconductor laser. If the optical disc memory or the laser beam printer is driven in spite of failure or degradation of the semiconductor laser, recorded information may be inadvertently lost.

Further, these information instruments are generally provided with an automatic power control circuit including a photodetector operative to detect a laser beam intensity for maintaining the laser beam intensity at constant under the stable state. If the semiconductor laser is continuously driven in spite of the fact that some failure or degradation has occurred in the photodetector, excessive driving current will flow the semiconductor laser to produce abnormally high laser beam output which would dangerously damage human eye.

Further, when any failure occurs in the automatic laser power control mechanism, power control of the laser beam does not work, thereby causing danger of excessive emission of the laser beam. For example, if such excessive emission occurs in the optical disc memory, information recorded in an optical disc may be destroyed. Further, if such excessive emission occurs in a bar code reader provided in a POS terminal or in a so-called pointer which utilizes good directivity of the laser beam, intensive laser beam may inadvertently irradiate onto human eye to destroy the same. The conventional semiconductor laser driving circuit is not provided with safety measure for failure of the automatic laser power control mechanism.

Moreover, the semiconductor laser has drawback that it is gradually degraded along the passage of time so that its emission is reduced. For example, a laser diode has a varying emission intensity which will be reduced gradually, due to time-dependent degradation or aging, even though a constant forward current is applied thereto. As long as the automatic laser power control mechanism operates normally to follow the laser emission variation, the laser beam is controlled to maintain a constant level so that the forward driving current increases with aging of the laser diode. When the aging progresses into a certain degree where the automatic power control cannot follow, the laser beam intensity suddenly reduces to cause abnormal state, thereby resulting in unexpected disability of the divices.

Recently, semiconductor lasers of high performance are mass-produced at low cost. As described above, the semiconductor laser is utilized as a component of a head of various information instruments. The semiconductor laser can continuously emit a laser beam having good directivity. Therefore the laser beam is quite dangerous to destroy human eye, when an excessively intensive laser beam inadvertently penetrates into human eye due to occurrence of abnormality, or even when a weak laser beam continuously irradiates human eye for a long time. Such accident may happen, for example, in case that the semiconductor laser is utilized as a scanner in a bar code reader. Otherwise, in case that the semiconductor laser is utilized in a head of the optical disc memory, when a rotation speed of the optical disc is reduced or stopped due to some emergency, recorded data may be destroyed by intensive irradiation of laser beam. In view of the above noted possible emergency, the semiconductor laser must be immediately shut down when rotation is stopped or reduced in a scanning motor used for scanning a laser beam or a spindle motor used for driving a compact disc and an optical disc, or when controlling of a microcomputer becomes out of order in information instruments, or when a head is exposed during operation of information instruments. For this reason, there is provided an inhibiting circuit responsive to an inhibition signal for forcibly shutting down a semiconductor laser. However, the conventional semiconductor laser driving circuit is provided with a single of the inhibiting circuit. Therefore, when this inhibiting circuit is incidentally broken down, the semiconductor laser cannot be immediately turned off in case of emergency, thereby causing a problem that accident is not prevented effectively.

SUMMARY OF THE INVENTION

In view of the above noted problems of the prior art, an object of the invention is to provide an improved semiconductor laser driving circuit operative to immediately detect abnormality due to failure or degradation of the semiconductor laser and photodetector to give warnings to CPU, peripheral device or operator so as to prevent accident.

Another object of the invention is to improve safety performance of the semiconductor laser driving circuit to prevent excessive emission of the laser beam.

A further object of the invention is to provide an alarm to indicate approaching replacement time of the semiconductor laser before the automatic laser power control fails unable due to aging of the semiconductor laser.

A still further object of the present invention is to provide and improved semiconductor laser driving circuit having high safety performance provided with a plurality of forcible shutdown circuits.

DETAILED DESCRIPTION OF PREFERRED EMBODIMENTS

First Embodiment

Figure 1:
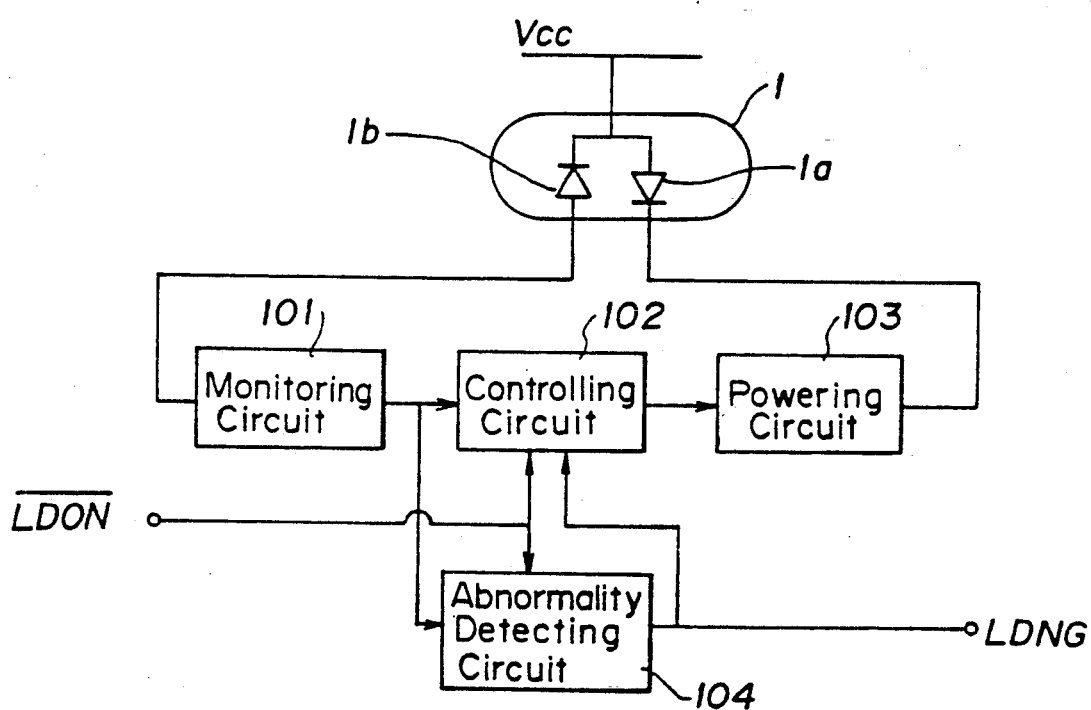
FIG. 1 is a structural block diagram of a first embodiment of the semiconductor laser driving circuit.

A first embodiment of the inventive semiconductor laser driving circuit has a basic structure as shown in FIG. 1. Namely, the semiconductor laser driving circuit is comprised of a laser package 1 containing a semiconductor laser in the form of a laser diode 1a and a photodetector in the form of a photodiode 1b. The photodiode 1b receives a laser beam emitted from the laser diode 1a to effect photo-electric conversion thereof to produce a corresponding electric signal. A monitoring circuit 101 is connected to the photodiode 1b to monitor the electric signal to produce a monitor signal indicative of variation in the laser beam intensity. A controlling circuit 102 is connected to the monitoring circuit 101 for comparing the monitor signal with a predetermined reference signal to produce a control signal according to difference therebetween. A powering circuit 103 is connected to the controlling circuit 102 for applying to the laser diode 1a a drive power according to the control signal so as to regulatively drive the laser diode 1a to remove or eliminate the difference between the varying monitor signal and the given reference signal. By such construction, the laser diode 1a, photodiode 1b, monitoring circuit 101, controlling circuit 102 and powering circuit 103 constitute together a servo loop effective to carry out automatic control of the laser beam intensity.

An abnormality detecting circuit 104 is connected to the monitoring circuit 101 for comparing the monitor signal with a limit signal which is set different than the reference signal so as to detect abnormality to thereby output an abnormality signal LDNG.

In preferred form, the controlling circuit 102 includes a shutdown circuit responsive to the abnormality signal LDNG to shut down or turn off the laser diode 1a.

In another preferred form, the abnormality detecting circuit 104 is constructed such as to produce an abnormality signal when the monitor signal falls below a lower limit signal which is set lower than the reference signal to indicate abnormal output reduction of either of the laser diode 1a or photodiode 1b. In addition, the abnormality detecting circuit is constructed such as to inhibit its own operation in response to a laser diode start signal $\overline{\text{LDON}}$ to suspend momentarily the abnormality detection in a certain starting time interval.

According to the first embodiment, when abnormality occurs in the laser diode, photodiode or automatic power control servo loop so that the monitor signal significantly varies relative to the reference signal, an abnormality signal is produced immediately. This abnormality signal is generated, for example, when the laser beam intensity falls or diminishes, or when the monitor signal reduces due to failure or breakdown of the photodiode, which would dangerously induce excessive emission of the laser beam through the servo loop.

Figure 2:
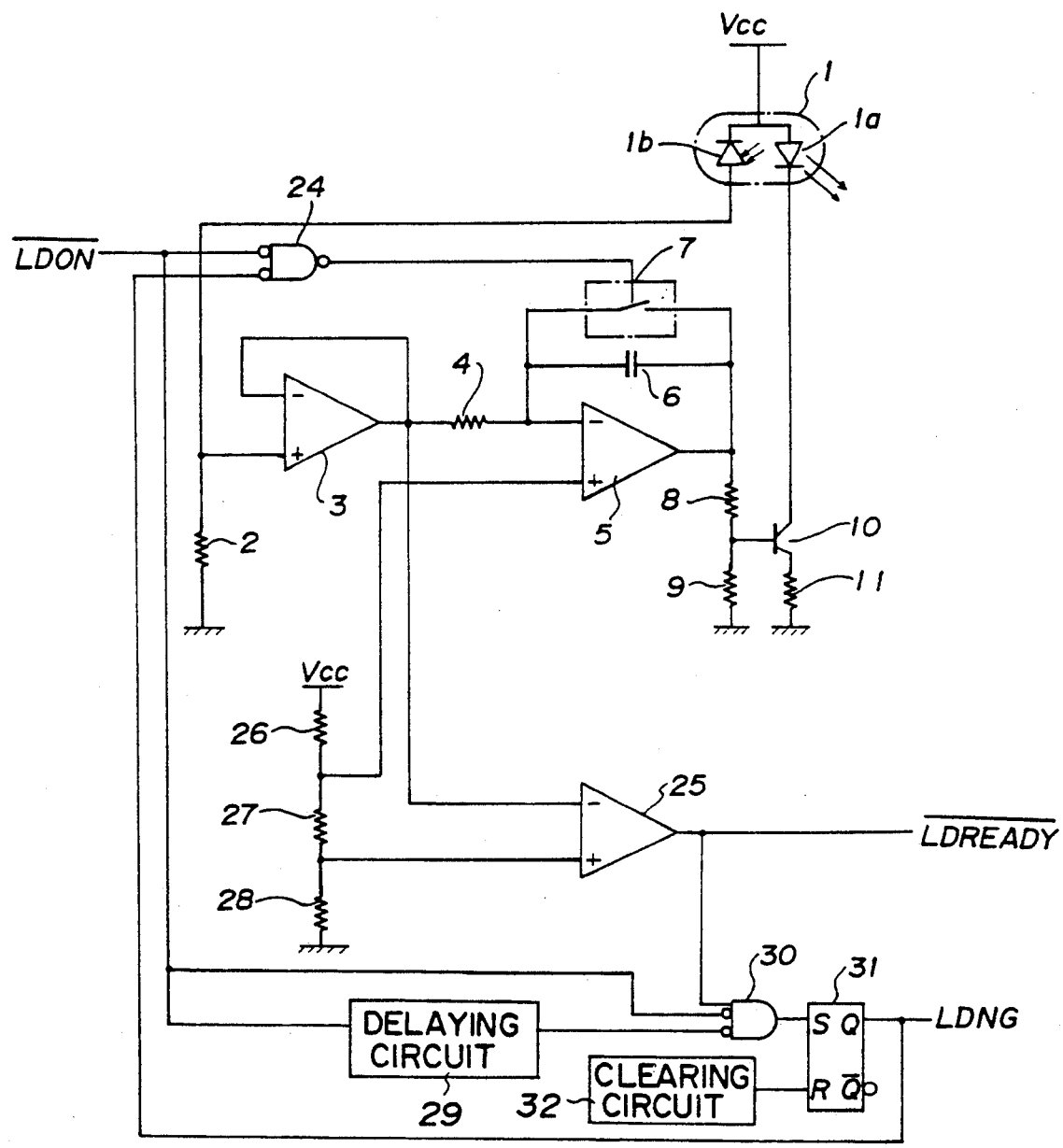
FIG. 2 is a detailed circuit diagram of the first embodiment.

Hereinafter, the first embodiment will be described in detail with reference to the drawings. FIG. 2 is a detailed circuit diagram of the first embodiment. As shown in the figure, the semiconductor laser driving circuit has a laser package 1 which contains laser diode 1a. Its anode terminal is connected to a power source line V . . . Further, the package 1 contains a photodiode 1b which is connected at its cathode terminal to the same power source line V . . .

The semiconductor laser driving circuit is further comprised of a monitoring circuit, a controlling circuit, a powering circuit and an abnormality detecting circuit. The monitoring circuit has a current-voltage conversion resistor 2 operative to convert a photocurrent outputted from the photodiode 1b into a corresponding voltage. This resistor 2 is connected at its one end to a positive input terminal of a differential amplifier 3, which has a negative input terminal and an output terminal directly connected to each other. Therefore, the amplifier 3 functions as a buffer to effect impedance conversion to produce a monitor signal at its output terminal. The monitor signal has a voltage level proportional to a laser beam intensity received by the photodiode 1b.

The controlling circuit is comprised of an integrating resistor 4, differential amplifier 5, integrating capacitor 6 and analog switch 7. The integrating resistor 4 is connected between the output terminal of the preceding amplifier 3 and a negative input terminal of the succeeding amplifier 5. The integrating capacitor 6 is connected between the negative input terminal and output terminal of the amplifier 5. Further, the amplifier 5 receives at its positive input terminal a reference signal having a predetermined voltage value. These resistor 4, amplifier 5 and capacitor 6 constitute together an integrating circuit operative to produce a control signal according to difference between the monitor signal and the reference signal. Further, an analog switch 7 is inserted between the negative input terminal and output terminal of the differential amplifier 5. In addition, the controlling circuit includes a shutdown circuit comprised of an AND gate circuit 24 having a pair of inverse input terminals. The AND gate circuit 24 receives at its one input terminal a start signal $\overline{\text{LDON}}$ effective to initiate powering of the laser diode 1a, and receives at its the other input terminal an abnormality signal LDNG. The AND gate circuit 24 is connected at its output terminal to the analog switch 7 to control conductivity thereof.

The powering circuit is comprised of a pair of voltage-dividing resistors 8 and 9, driving transistor 10 and voltage-current conversion resistor 11. The transistor 10 has a base terminal connected to the output terminal of amplifier 5 through one voltage-dividing resistor 8, a collector terminal connected to a cathode terminal of the laser diode 1a, and an emitter terminal grounded through the resistor 11.

The abnormality detecting circuit includes a comparator 25 having a negative input terminal receptive of the monitor signal and a positive input terminal receptive of a given limit signal. Series-connected voltage-dividing resistors 26, 27 and 28 set a voltage level of the limit signal lower than that of the reference signal. In this embodiment, the magnitude of the limit signal is set smaller than that of the reference signal by 5%. The comparator 25 produces at its output terminal a ready signal $\overline{\text{LDREADY}}$ having a voltage level which can be inverted according to the relative level relation between the monitor signal and the limit signal. The abnormality detecting circuit further includes a three-input AND gate circuit 30 having a first input terminal connected to the output terminal of the comparator 25, a second inverse input terminal receptive of the start signal $\overline{\text{LDON}}$, and a third inverse input terminal receptive of the start signal $\overline{\text{LDON}}$ through a delaying circuit 29. An RS flipflop 31 is connected at its set terminal S to an output terminal of the AND gate circuit 30. Further, a clearing circuit 32 is connected to a reset terminal R of the RS flipflop 31 for resetting the flipflop 31 at the time of turning on the power supply. The flipflop 31 produces the abnormality signal LDNG at its output terminal Q. In the above described embodiment, the AND gate circuits 24 and 30, delaying circuit 29 and flipflop 31 are comprised of individual circuit elements; however, these components can be functionally integrated in a microcomputer device provided in the semiconductor laser control system.

Next, the description is given for the operation of the FIG. 2 semiconductor laser driving circuit. Firstly with regard to the automatic laser power control operation, when the low-active start signal $\overline{\text{LDON}}$ is turned to a low level, the analog switch 7 is made nonconductive through the AND gate circuit 24 so that the controlling circuit and the powering circuit start to operate. Concurrently, the laser diode 1a is activated to emit laser beam, and the photodiode 1b starts to produce a photocurrent proportionally to the laser beam intensity. This photocurrent is converted into a corresponding voltage by means of the current-voltage conversion resistor 2. The buffer amplifier 3 effects impedance conversion with respect to the corresponding voltage to produce a monitor signal at its output terminal. Accordingly, this monitor signal has a voltage value proportional to the intensity of laser beam received by the photodiode 1b.

The integrator composed of integrating resistor 4, differential amplifier 5 and integrating capacitor 6 operates such that the integrating capacitor 6 is charged and discharged regulatively according to the voltage difference between the reference signal $V_{ref}$ applied to the positive input terminal of the differential amplifier 5 and the monitor signal applied to the negative input terminal thereof. Consequently, the amplifier 5 produces at its output terminal a control signal having an output voltage according to that voltage difference. This output voltage is divided by the pair of resistors 8 and 9. The divided voltage is converted into a drive current by means of the driving transistor 10 to drive the laser diode 1a. This drive current is applied to the laser diode 1a so as to remove or eliminate the voltage difference between the varying monitor signal and the constant reference signal. Therefore, in the stable state, the voltage level of the monitor signal is held equal to that of the reference signal so that the laser beam intensity can be automatically controlled constant in spite of variation in the ambient temperature and moderate degradation of the laser diode.

On the other hand, when the start signal $\overline{\text{LDON}}$ is returned from the low level to the high level, the analog switch 7 is made conductive through the AND gate circuit 24 so that electric charge stored in the capacitor 6 is totally discharged. Consequently, the output voltage of the control signal is made equal to the reference voltage $V_{ref}$. The resistance ratio of the voltage-dividing resistors 8 and 9 is set such that the pair of resistors 8 and 9 divide the output voltage which is equalized to the reference voltage to produce a divided voltage effective to turn off the driving transistor 10 to thereby shut down the laser diode 1a.

Figure 3:
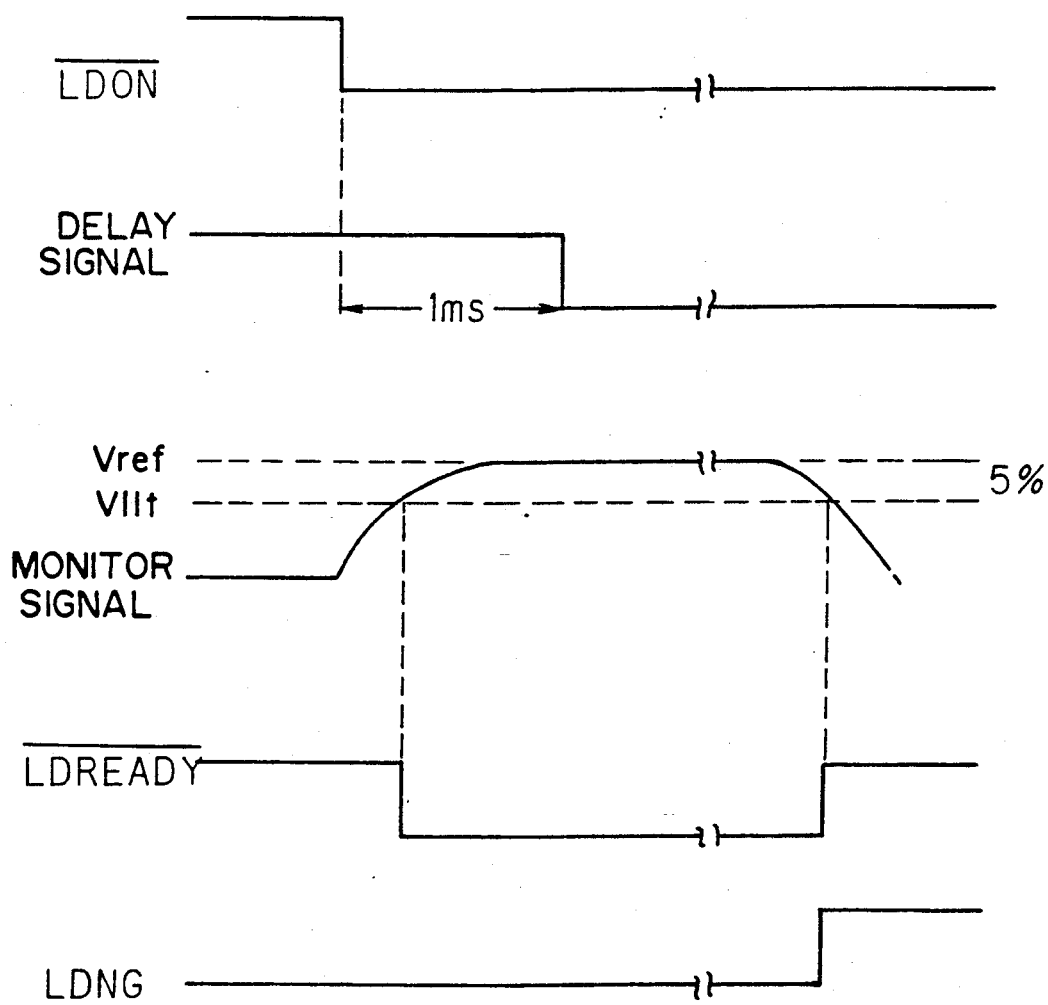
FIG. 3 is a timing chart showing the operation of the first embodiment.

Next, the detailed description is given for the operation of the abnormality detecting circuit which is the characterizing element of the invention, in conjunction with a timing chart shown in FIG. 3. Firstly, the start signal $\overline{\text{LDON}}$ is changed from the high level to the low level to initiate activation of the laser diode 1a. This start signal $\overline{\text{LDON}}$ is directly applied to one of the inverse input terminals of the AND gate circuit 30. This start signal $\overline{\text{LDON}}$ separately passes through the delaying circuit 29 in the form of a delay signal which is delayed from the original start signal $\overline{\text{LDON}}$ by a given interval of, for example, 1 ms, and which is then fed to the other inverse input terminal of the AND gate circuit 30. This delay interval is set longer than a rising time interval during which the automatic laser power control is effectively carried out so that the laser beam intensity reaches a stable level. For example, if the intergrator has a time constant in the order of 500 μs, the delay time interval is set to 1 ms. As a result of this operation the AND gate 30 is made open 1 ms after the initiation of the laser diode. On the other hand, the drive current is supplied to the laser diode to start emission in response to the inversion of the start signal $\overline{\text{LDON}}$. Simultaneously, the voltage level of the monitor signal rises gradually. Then, when the voltage level of the monitor signal exceeds the limit voltage level $V_{lit}$, the ready signal or state signal $\overline{\text{LDREADY}}$ provided from the comparator 25 is switched from the high level to the low level. This switching indicates that emission of the laser beam is shifting from the transition state to the stable state. Therefore, when the state signal is switched to the low level, a central device or a peripheral device is placed in regular operation state. As described before, the inversion of the state signal normally occurs during the preset delay interval, hence this inversion change does not pass the AND gate circuit 30 so that the output level of the RS flipflop does not change. After the monitor signal exceeds the limit voltage level $V_{lit}$, the monitor signal continues to rise according to the automatic laser power control to thereby reach the reference voltage level $V_{ref}$ which is set higher than the limit voltage level $V_{lit}$ by 5%. At this time, the delay time interval has been lapsed so that the AND gate circuit 30 is set open to enable the abnormality detecting circuit.

Along the passage of time, abnormality may occur in the laser diode 1a, photodiode 1b or automatic laser power control system. The voltage level of the monitor signal abruptly or gradually falls when the abnormality is caused by failure or serious degradation of the laser diode 1a, by failure of the automatic laser power control mechanism, or by failure or opening defect of the photodiode 1b. When this variation falls outside a controllable range of the automatic laser power control mechanism, this mechanism no longer functions properly and therefore the voltage level of the monitor signal deviates from the reference voltage level to further fall below the limit voltage level. When the voltage level of the monitor signal crosses the limit voltage level, the state signal $\overline{\text{LDREADY}}$ is reversed from the low level to the high level by means of the comparator 25. Consequently, the state signal $\overline{\text{LDREADY}}$ indicates that the semiconductor laser driving circuit is not in the normal state any longer. Simultaneously, this reverse change of the state signal is transmitted to the set terminal S of the RS flipflop 31 through the open AND gate circuit 30. Accordingly, the output level appearing at the output terminal Q of the RS flipflop 31 is turned from the low level to the high level to produce an abnormality signal LDNG, which notice to a host computer such as CPU and to peripheral devices the fact that abnormality has occurred. Further, the abnormality signal LDNG is applied to the inverse input terminal of the AND gate circuit 24 which constitutes the shutdown circuit. Consequently, the analog switch 7 is made conductive so that the controlling circuit and the powering circuit stop the operation and therefore the laser diode 1a is forcibly turned off. As a result, dangerous excessive emission of the laser beam can be effectively prevented, which would otherwise be caused due to unable automatic laser power control when the abnormality is not due to the laser diode but is due to the photodiode.

Figure 4:
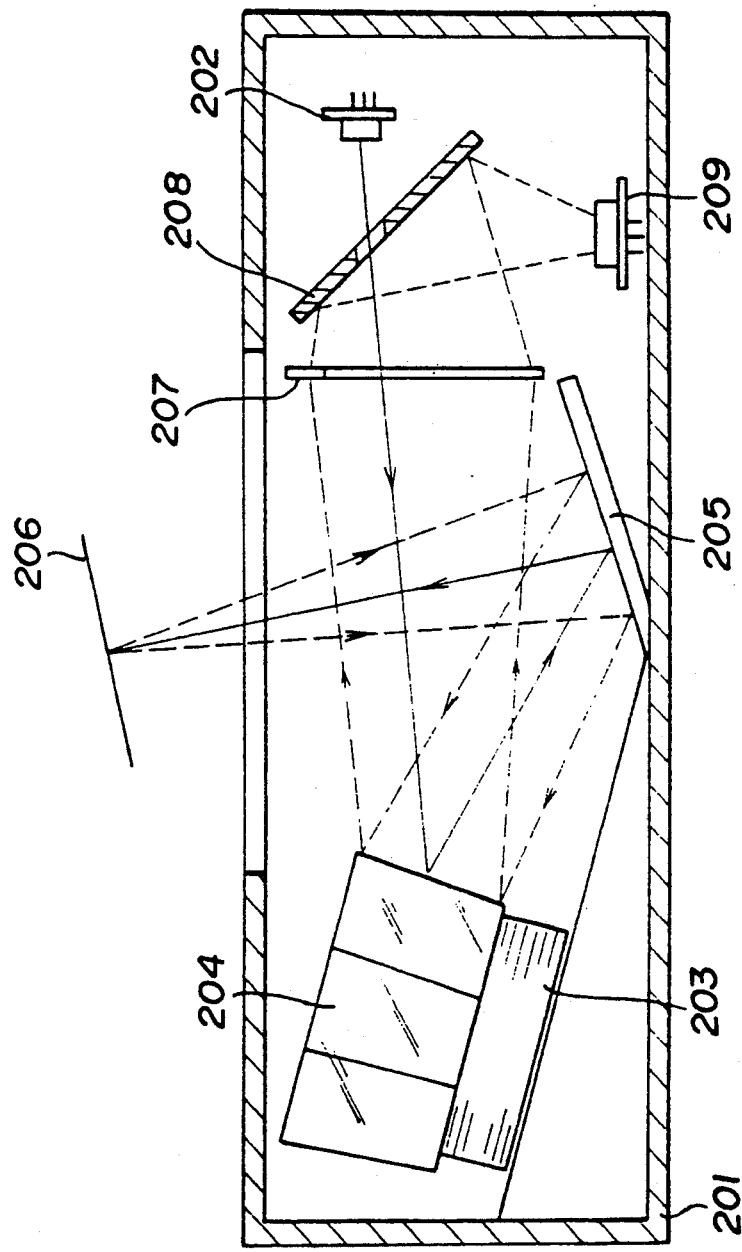
FIG. 4 is a schematic sectional view of a bar code reader which contains the semiconductor laser driving circuit.

FIG. 4 is a schematic sectional view showing a bar code reader which utilizes a laser source provided with the inventive semiconductor laser driving circuit, to illustrate one application of the invention. As shown in the figure, the bar code reader has a laser source 202 contained in a casing 201. This laser source 202 has a circuit construction shown in FIG. 1, provided with a laser diode, an automatic laser power control mechanism and an abnormality detecting circuit. The laser source 202 emits a laser beam, which is reflectively scanned by a polygon mirror 204 rotated by a scanning motor 203. The scanned laser beam is directed through a mirror 205 to a bar code 206 placed on an article. After scanning across the bar code 206, the reflected light is reversed and collected by a focusing lens 207. The focused light is received through a mirror 208 by a photosensor 209. The received light is analyzed to read the bar code 206. In such construction of the bar code reader, when abnormality occurs in the laser diode or a photodiode provided in the laser source 202 due to failure or degradation, the abnormality signal is outputted immediately. The bar code reader stops its reading operation in response to the abnormality signal. Therefore, it is possible to prevent the bar code reader from erroneous reading, which would be caused when the bar code reader continues to reading operation in spite of the fact that the normal reading is impossible due to, for example, serious degradation of the laser diode. Otherwise, it is possible to prevent the laser diode from emitting excessively intense laser beam which would be caused by open failure of the photodiode and which would inadvertently damage human eye.

As described above, according to the invention, in the semiconductor laser driving circuit having automatic laser power control mechanism, an abnormality signal is produced immediately when a laser diode or a monitoring photodiode suffers from degradation or failure. By such construction, there can be provided advantages such as inadvertent operation of devices utilizing the laser diode can be effectively avoided, and accident by excessive emission of the laser beam can be effectively prevented.

Second Embodiment

Figure 5:
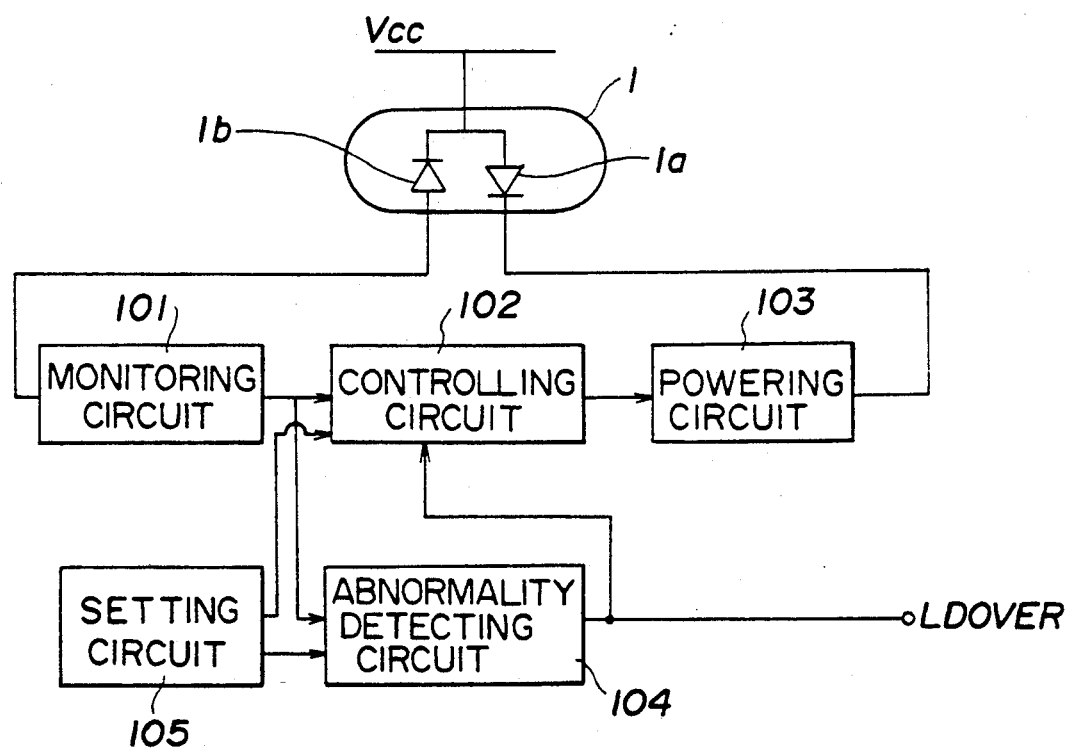
FIG. 5 is a structural block diagram of a second embodiment of the semiconductor laser driving circuit.

A second embodiment of the inventive semiconductor laser driving circuit has a basic structure as shown in FIG. 5. Namely, the semiconductor laser driving circuit is comprised of a laser package 1 containing a semiconductor laser in the form of a laser diode 1a which emits a laser beam according to a drive power and a photodetector in the form of a PIN photodiode 1b. The photodiode 1b receives a laser beam emitted from the laser diode 1a to effect photo-electric conversion thereof to produce a corresponding electric signal. A monitoring circuit 101 is connected to the photodiode 1b to monitor the electric signal to produce a monitor signal indicative of variation in the laser beam intensity. A controlling circuit 102 is connected to the monitoring circuit 101 for comparing the monitor signal with a predetermined reference signal to produce a control signal according to difference therebetween. A powering circuit 103 is connected to the controlling circuit 102 for applying to the laser diode 1a a drive power according to the control signal so as to regulatively drive the laser diode 1a to remove or eliminate the difference between the varying monitor signal and the given reference signal. By such construction, the laser diode 1a, photodiode 1b, monitoring circuit 101, controlling circuit 102 and powering circuit 103 constitute together a servo loop effective to carry out automatic control of the laser beam intensity.

Further, the semiconductor laser driving circuit includes a setting circuit 105 for setting and providing an upper limit signal greater than the reference signal and smaller than a certain signal level which cannot be exceeded by the monitor signal during normal operation, i.e., during the course when the automatic laser power control mechanism works stably without any failure. An abnormality detecting circuit 104 is connected to the setting circuit 105 for comparing the upper limit signal and the monitor signal with each other so as to detect abnormality to produce an abnormality signal LDOVER. This abnormality detecting circuit includes a comparator circuit operative when the monitor signal exceeds the upper limit signal to output an inversion signal, and a latching circuit for latching the inversion signal to continuously produce the abnormality signal. Further, the semiconductor laser driving circuit is provided with a shutdown circuit responsive to the abnormality signal to forcibly turn off the semiconductor laser.

According to the second embodiment, the abnormality detecting circuit operates when the monitor signal exceeds the upper limit signal which is set greater than the reference signal for outputting the abnormality signal. Therefore, the abnormality signal occurs when the automatic laser power control mechanism suffers from some abnormality which may not cause deficient emission or breakdown of the laser diode but may cause excessive emission. This abnormality signal is transmitted to a higher or lower rank devices to prevent accident due to possible excessive emission.

Figure 6:
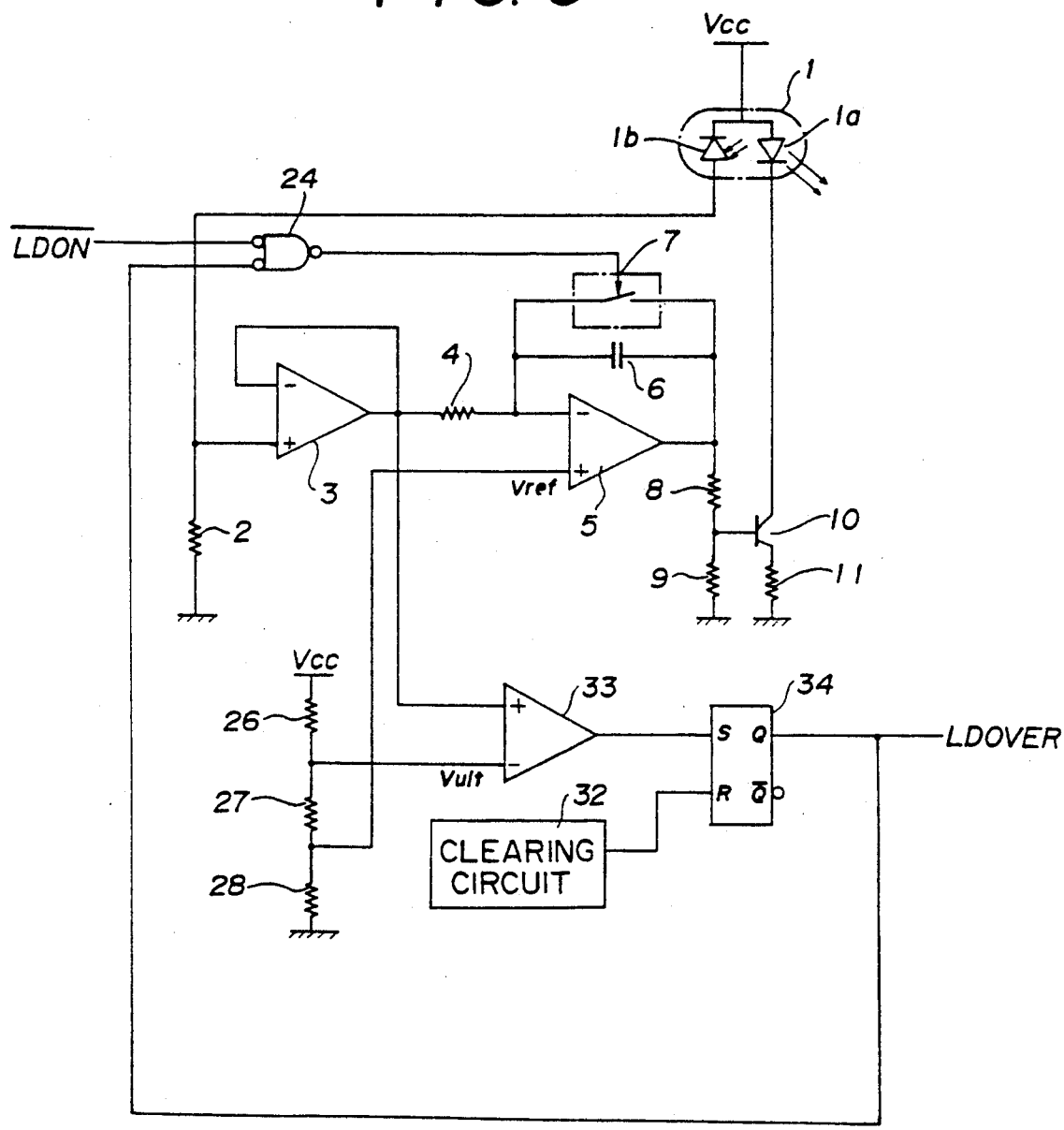
FIG. 6 is a detailed circuit diagram of the second embodiment.

Hereinafter, the second embodiment will be described in detail with reference to the drawings. FIG. 6 is a detailed circuit diagram of the second embodiment. As shown in the figure, the semiconductor laser driving circuit is comprised of a laser package, monitoring circuit, controlling circuit, powering circuit, setting circuit, abnormality detecting circuit and shutdown circuit. The same element is denoted by the same reference numeral as in the first embodiment to facilitate readily understanding of this embodiment. Different points are spesifically described hereinbelow.

First of all, the setting circuit is comprised of three voltage-dividing resistors 26, 27 and 28 series-connected to each other between the power source line $V_{cc}$ and the ground line. A voltage $V_{ref}$ appearing at the lower end of the intermediate resistor 27 is applied as the reference signal to the positive input terminal of the differential amplifier 5. A voltage $V_{ult}$ appearing at the upper end of the same resistor 27 is outputted as the upper limit signal. As understood from the figure, the upper limit voltage $V_{ult}$ is set greater than the reference voltage $V_{ref}$ according to a voltage drop across the voltage-dividing resistor 27. This difference is optimumly determined by appropriately setting resistance value of the voltage-dividing resistor 27. Namely, the upper limit voltage $V_{ult}$ is set such that the monitor signal cannot exceed the upper limit voltage $V_{ult}$ as long as the automatic laser power control mechanism works effectively in the normal operation. The difference is preferably set 5% -10% between the upper limit voltage $V_{ult}$ and the reference voltage $V_{ref}$.

The abnormality detecting circuit is comprised of a comparator 33, a latching circuit in the form of an RS flipflop 34 and a clearing circuit 32. The comparator 33 receives at its positive input terminal the monitor signal, and receives at its negative input terminal the upper limit signal. Therefore, the comparator 33 produces an inversion signal at its output terminal when the monitor signal exceeds the upper limit signal. The RS flipflop 34 is connected at its set terminal S to the output terminal of the comparator 33, and is connected at its reset terminal R to the clearing circuit 32. The flipflop 34 latches the inversion signal to output an abnormality signal LDOVER at its output terminal Q. The clearing circuit 32 operates when the power supply is turned on to reset the flipflop 34 to initialize the abnormality detecting circuit.

Figure 7:
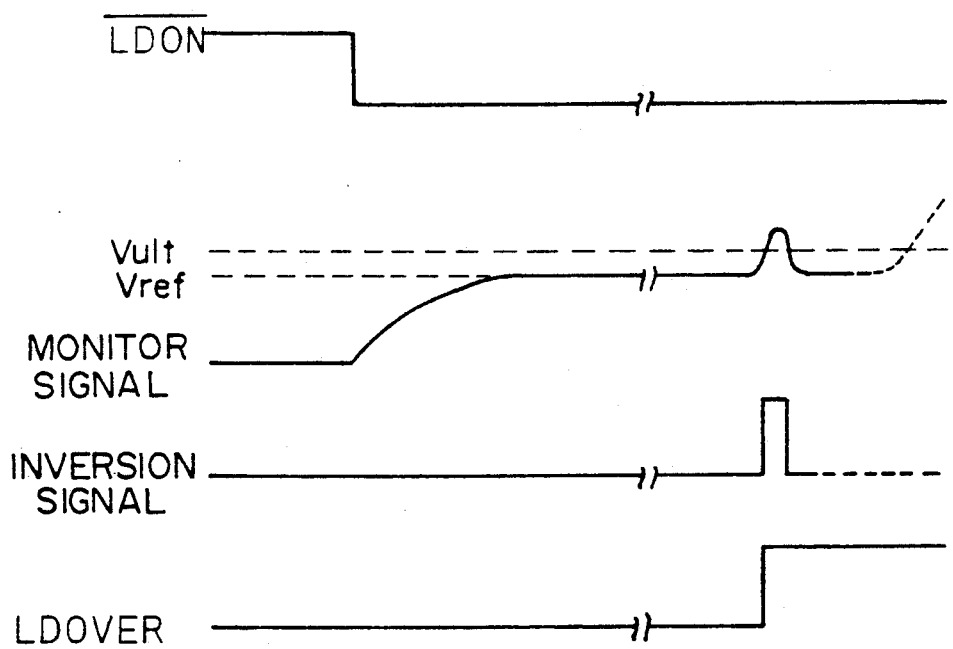
FIG. 7 is a timing chart showing the operation of the second embodiment.

Next, the description is given for the operation of the FIG. 6 semiconductor laser driving circuit with reference to the FIG. 7 timing chart. Firstly, the automatic light power control operation is similar to that of the first embodiment, and therefore can be readily understood.

Thus, the description is given hereinbelow specifically for the operation of the abnormality detecting circuit. As described before, the voltage level of the monitor signal substantially coincides with the reference voltage $V_{ref}$ as long as the automatic laser power control mechanism operates normally. This stabilized monitor signal is supplied to the positive input terminal of the comparator 33, and the upper limit voltage $V_{ult}$ is continuously applied to the negative input terminal of the comparator 33. This upper limit voltage $V_{ult}$ is set higher than the reference voltage $V_{ref}$ such that the varying monitor signal cannot exceed the upper limit voltage in the normal operation. Therefore, the output level of the comparator 33 is normally held at the low level. However, when excessive emission from the laser diode occurs due to abnormality of the automatic laser power control mechanism or when short defect occurs in the photodiode which is utilized for monitoring or detecting the laser beam intensity, the voltage level of the monitor signal rises to exceed the upper limit voltage level so that the output level of the comparator 33 is inverted to the high level. Once the inversion occurs even momentarily, the flipflop 34 switches to output the abnormality signal LDOVER which is shifted from the low level to the high level. Consequently, the abnormality state caused in the automatic laser power control mechanism is detected in the form of the level change in the abnormality signal, which is then transmitted outside. In addition, when the abnormality signal LDOVER is switched from the low level to the high level, the AND gate circuit 24 is forcibly closed so that the analog switch 7 is placed in the conductive state in spite of the enabling start signal $\overline{\text{LDON}}$. Accordingly, the automatic laser power control mechanism stops its operation to forcibly turn off the laser diode. Namely in the present embodiment, if abnormality occurs even momentarily, the inversion signal changes and this change is latched to thereby continuously output the abnormality signal. Therefore, before serious accident happens, the abnormality is detected to execute effective counter measure.

Third Embodiment

A third embodiment is directed to further improve safety of the semiconductor laser driving circuit. In order to achieve the purpose, there is provided likewise an abnormality detecting circuit for detecting abnormality which may occur in the automatic power control circuit. Moreover, a checking circuit is particularly provided to check provisionally as to if the abnormality detecting circuit correctly works when the automatic power control circuit suffers from abnormality. By providing such double measure, the safety performance of semiconductor laser driving circuit is considerably improved as compared to the prior art. Generally, the automatic power control circuit rarely shows abnormality, hence the abnormality detecting circuit actually works quite rarely. Therefore, it is quite important to periodically check as to whether the abnormality detecting circuit works correctly.

Figure 8:
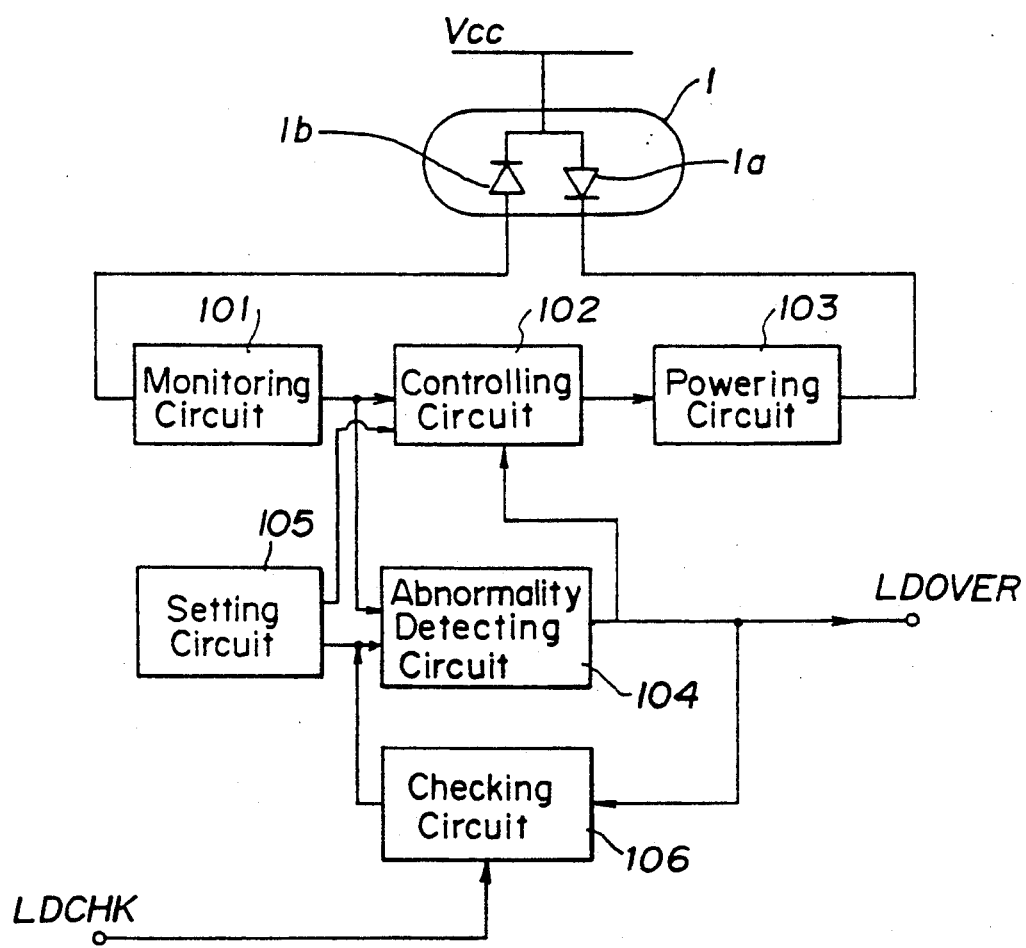
FIG. 8 is a structural block diagram of a third embodiment of the semiconductor laser driving circuit.

The third embodiment of the inventive semiconductor laser driving circuit has a basic structure as shown in FIG. 8. Namely, the semiconductor laser driving circuit is comprised of a laser package 1 containing a semiconductor laser in the form of a laser diode 1a which emits a laser beam according to an applied drive power and a photodetector in the form of a PIN photodiode 1b. The photodiode 1b receives a laser beam emitted from the laser diode 1a to effect photoelectric conversion thereof to produce a corresponding electric signal. A monitoring circuit 101 is connected to the photodiode 1b to monitor the electric signal to produce a monitor signal indicative of variation in the laser beam intensity. A controlling circuit 102 is connected to the monitoring circuit 101 for comparing the monitor signal with a predetermined reference signal to produce a control signal according to difference therebetween. A powering circuit 103 is connected to the controlling circuit 102 for applying to the laser diode 1a a drive power according to the control signal so as to regulatively drive the laser diode 1a to cancel or null the difference between the varying monitor signal and the given reference signal. By such construction, the laser diode 1a, photodiode 1b, monitoring circuit 101, controlling circuit 102 and powering circuit 103 constitute together a servo loop effective to carry out automatic control of the laser beam intensity.

Further, the semiconductor laser driving circuit includes a setting circuit 105 for setting and providing an upper limit signal greater than the reference signal and smaller than a certain signal level which cannot be exceeded by the monitor signal during normal operation, as well as for setting the reference signal. An abnormality detecting circuit 104 is connected to the setting circuit 105 for comparing the upper limit signal and the monitor signal with each other so as to detect abnormality to produce an abnormality signal LDOVER. A checking circuit 106 is connected to the abnormality detecting circuit 104 to operate while the laser diode 1a is normally driven by means of the automatic laser power control mechanism to lower the level of the upper limit signal below the reference signal in response to a check signal LDCHK to thereby enable the abnormality detecting circuit to produce intentionally an abnormality signal LDOVER in order to periodically confirm correct operation of the abnormality detecting circuit 104. The checking circuit includes a switching circuit responsive to the occurrence of the check signal LDCHK for shifting the upper limit signal level below the reference signal, and a resetting circuit responsive to removal of the check signal LDCHK to reset a latching circuit to erase the intentionally produced abnormality signal LDOVER.

The abnormality detecting circuit includes a comparator operative when the monitor signal exceeds the upper limit signal to output an inversion signal, and the latching circuit for latching the inversion signal to continuously produce the abnormality signal. Further, the semiconductor laser driving circuit is provided with a shutdown circuit responsive to the abnormality signal to forcibly turn off the semiconductor laser.

According to the third embodiment, the abnormality detecting circuit regularly observes the monitor signal relative to the upper limit signal so as to output an abnormality signal when the monitor signal exceeds the upper limit signal to thereby prevent excessive emission of the laser beam. Further, the checking circuit periodically checks the abnormality detecting circuit to ensure that the abnormality detecting circuit correctly works when abnormality occurs in the automatic laser power control mechanism.

Figure 9:
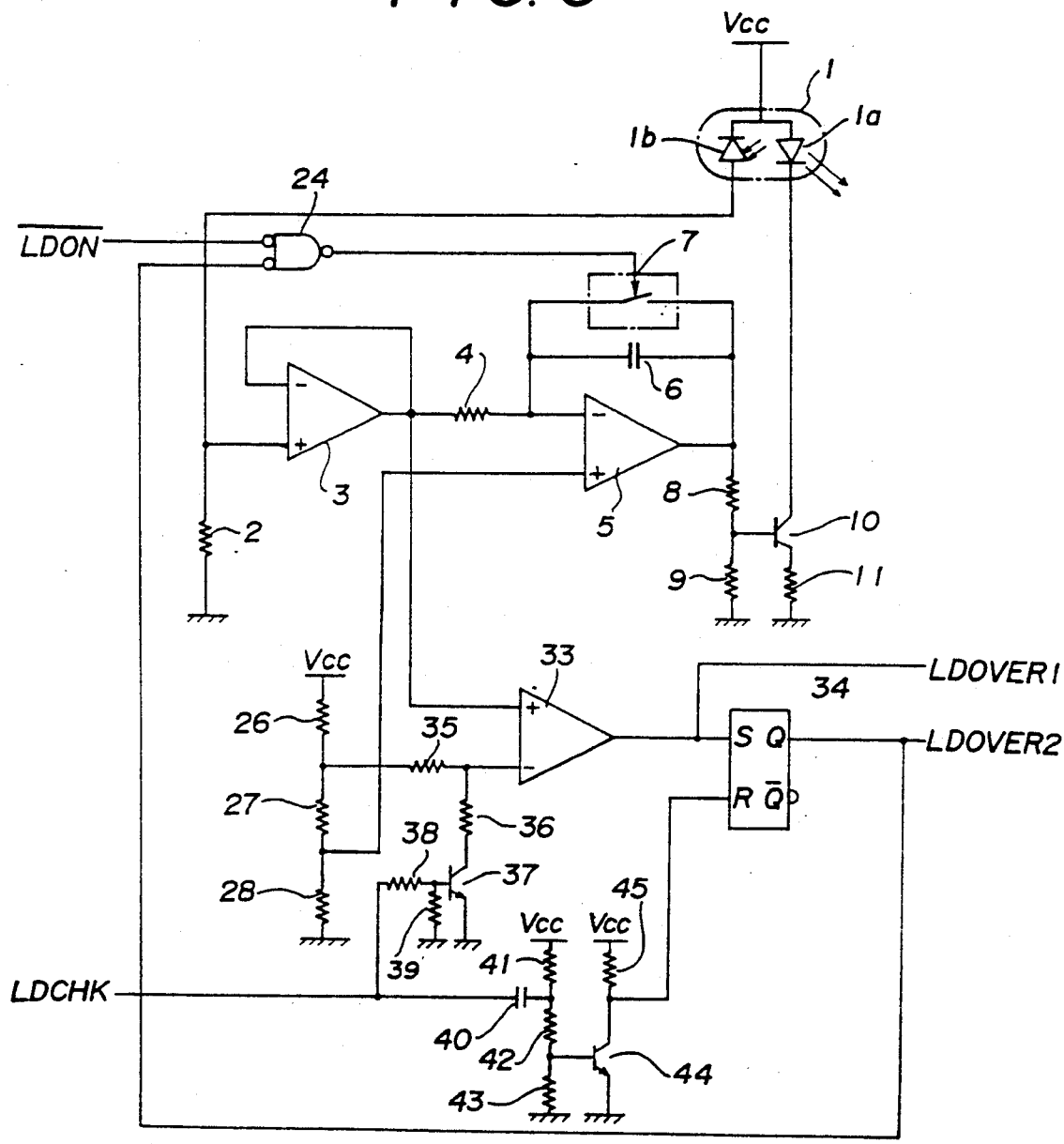
FIG. 9 is a detailed circuit diagram of the third embodiment.

Hereinafter, the third embodiment will be described in detail with reference to the drawings. FIG. 9 is a detailed circuit diagram of the third embodiment of the inventive semiconductor laser driving circuit. As shown in the figure, the semiconductor laser driving circuit has a laser package 1. The semiconductor laser driving circuit is further comprised of a monitoring circuit, a controlling circuit and a powering circuit, those of which constitute the automatic laser power control mechanism. An abnormality detecting circuit is also included. These components are similar to the second embodiment, and therefore they can be readily understood. Thus, the description is given for a specifically added checking circuit.

The checking circuit is comprised of a switching circuit and a resetting circuit. The switching circuit is responsive to an externally inputted check signal LDCHK for shifting the level of the upper limit signal below the reference signal level to work the abnormality detecting circuit to produce temporarily an abnormality signal LDOVER2 to thereby check its operability. The resetting circuit is responsive to removal of the check signal LDCHK for resetting the flipflop circuit 34 to remove the temporarily produced abnormality signal LDOVER2. The switching circuit is comprised of a switching transistor 37 and resistors 36, 38 and 39. The switching transistor 37 has a base terminal receptive of the check signal LDCHK through the bias resistor 38, a collector teminal connected through the voltage-dividing resistor 36 to the negative input terminal of the comparator 33, and a grounded emitter terminal.

The resetting circuit is comprised of a differentiating circuit responsive to a trailing edge of the check signal LDCHK to form a pulse, and an inverter for inverting the formed pulse to produce a reset pulse signal. The differentiating circuit is comprised of a capacitor 40 and series-connected resistors 41, 42 and 43. The inverter is comprised of a transistor 44 and a resistor 45. The transistor 44 has a base terminal connected to the output terminal of the differentiating circuit, a collector terminal connected to a reset terminal R of the flipflop circuit 34, and a grounded emitter terminal.

Next, the description is given for the operation of the FIG. 9 semiconductor laser driving circuit. Firstly, the automatic laser power control operation and the abnormality detection operation are similar to the second embodiment, and therefore can be readily understood.

Figure 10:
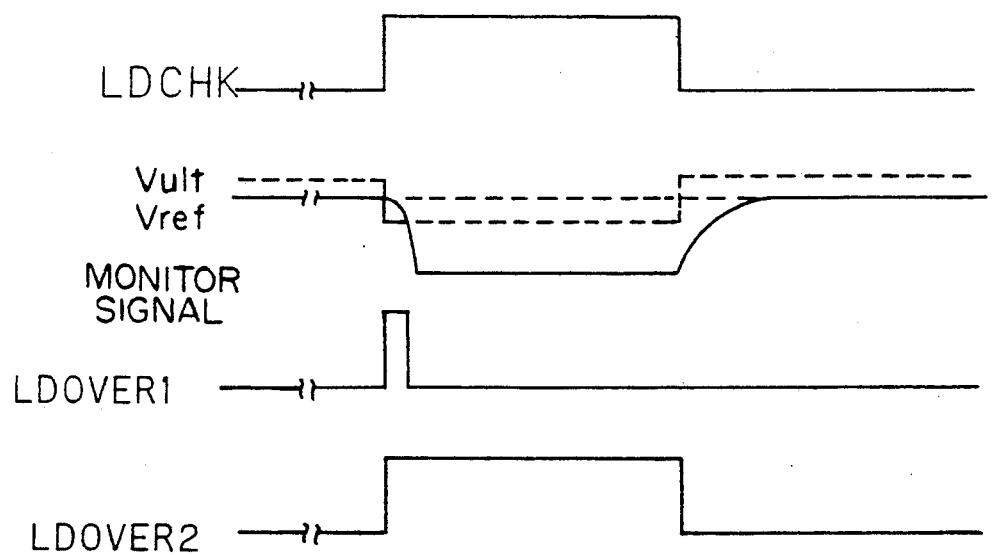
FIG. 10 is a timing chart showing the checking operation of the third embodiment.

Thus, the operation of the checking circuit is specifically described hereinbelow with reference to FIG. 10. The check signal LDCHK is switched from the low level to the high level during a checking period. The checking operation is carried out while the automatic laser power control mechanism is operating normally, i.e., while the monitor signal is held at the reference voltage level $V_{ref}$. This checking can be carried out each time the laser diode is turned on, or can be carried out periodically according to a given program. When the check signal LDCHK rises, the switching transistor 37 is turned on so that the current flow is switched from the series-connected resistors 26, 27 and 28 to a resistor network 26, 35 and 36. The composite resistance of the resistors 35 and 36 is set smaller than that of the resistors 27 and 28, hence the upper limit voltage level $V_{ult}$ is shifted below the reference voltage level $V_{ref}$. Consequently, the monitor signal held at the reference voltage level $V_{ref}$ exceeds relative to the lowered upper limit voltage level to thereby produce an intentional abnormality signal. Consequently, the output level of the comparator 33 is inverted so that the state signal or inversion signal LDOVER1 is changed from the low level to the high level. The flipflop 34 is inverted in response to this change so that the abnormality signal LDOVER2 is inverted from the low level to the high level. This occurrence of the intentional abnormality signal indicates that the abnormality detecting circuit works correctly. As described before, when the abnormality signal LDOVER2 is turned to the high level, the laser diode 1a is automatically shut down. Consequently, the monitor signal instantly falls to zero level, hence the voltage level of the monitor signal is temporarily lowered than the shifted upper limit voltage $V_{uh}$ so that the inversion signal LDOVER1 at the output terminal of the comparator 33 returns to the low level. However, the abnormality signal LDOVER2 is continuously latched at the high level by means of the flipflop 34. When the check signal LDCHK is returned from the high level to the low level after the lapse of the given check interval or duration, the resetting circuit operates to reset the flipflop 34. Accordingly, the abnormality signal LDOVER2 returns to the low level to shift to the normal operation.

Figure 11:
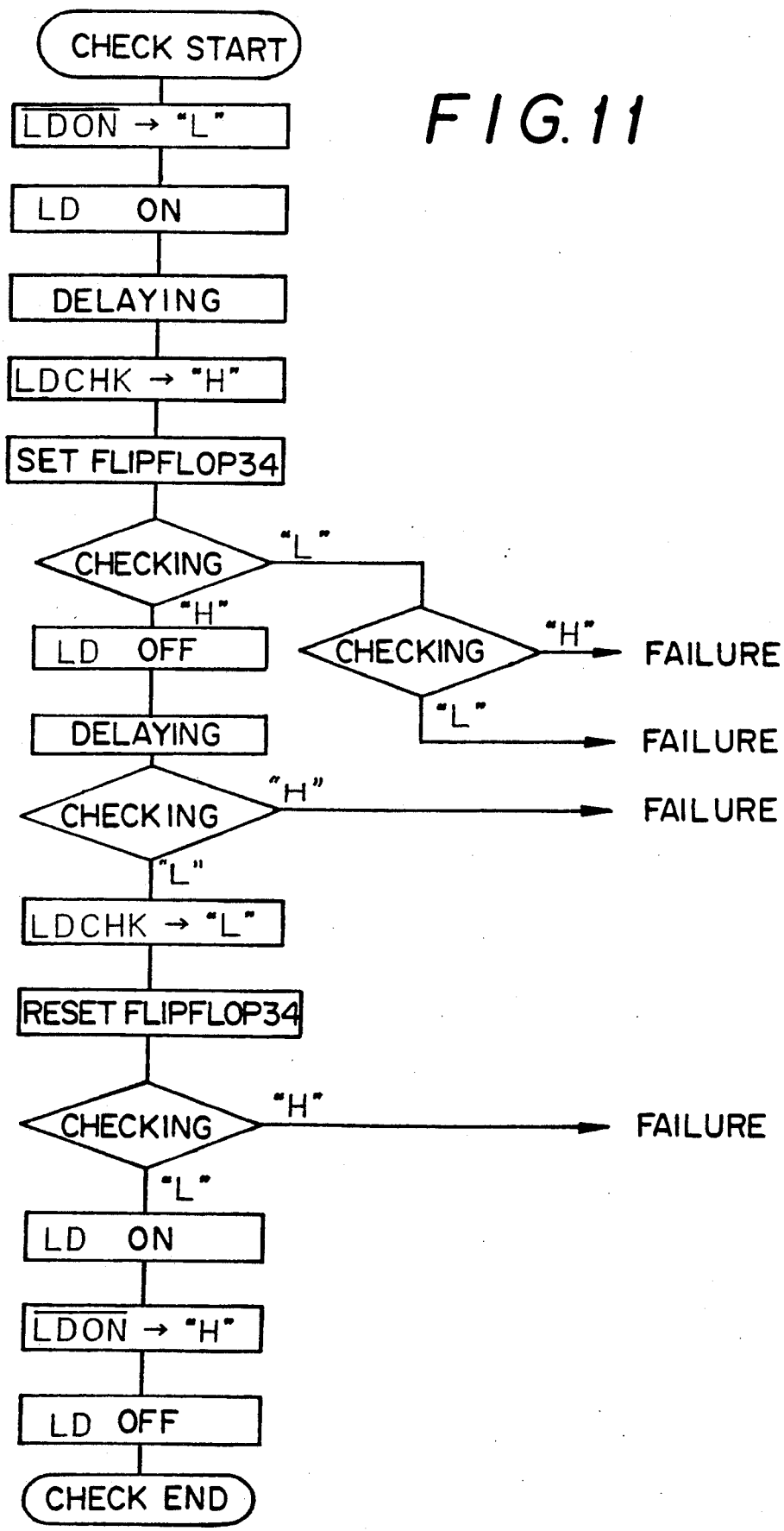
FIG. 11 is a checking flow chart of the third embodiment.

Lastly, the description is given for failure analysis program of the abnormality detecting circuit by means of the checking circuit with reference to FIG. 11. The failure analysis is initiated so that the start signal $\overline{\text{LDON}}$ turns to the active low level (the low level is indicated by "L" in the FIG. 11 flowchart) to turn on the laser diode (the laser diode is indicated by "LD" in the flowchart). After a given delay period while the laser diode reaches the stable emission state, the check signal LDCHK is switched to the high level (the high level is indicated by "H" in the flowchart) to set the flipflop circuit 34. At this time, the voltage level of the abnormality signal LDOVER2 is checked. If the signal LDOVER2 stays in the low level, the voltage level of the inversion signal LDOVER1 is also checked. As a result of the checking, if the inversion signal LDOVER1 is at the high level, judgement is made that the flipflop circuit 34 is defective. On the other hand, if the signal LDOVER1 is at the low level, judgement is made that the laser diode does not emit a laser beam or the comparator 33 is defective.

On the other hand, if the abnormality signal LDOVER2 is correctly turned to the high level, the laser diode is forcibly shut down. After the lapse of a given delay time, the voltage level of the signal LDOVER1 is checked. If the signal LDOVER1 remains at the high level, the shutdown of the laser diode has not been effected and judgement is made that the AND gate circuit 24 is defective. In turn, if the signal LDOVER1 restores its low level, subsequently the check signal LDCHK is returned to the low level. Consequently, the flipflop circuit 34 is reset. Then the voltage level of the abnormality signal LDOVER2 is checked. If the signal LDOVER2 stays in the high level, judgement is made that the flipflop circuit 34 is defective or the resetting circuit is defective. On the other hand, if the signal LDOVER2 restores the low level, the shutdown of the laser diode is released so that the laser diode again emits a laser beam. Lastly, the start signal $\overline{\text{LDON}}$ is set to the high level to turn off the laser diode according to the regular operation to complete the failure analysis.

Fourth Embodiment

Generally, the automatic laser power control mechanism is provided with a photodetector for receiving a laser beam, and a detecting resistor for detecting an electric signal fed from the photodetector to produce a monitor signal used in the automatic laser power control. This detecting resistor has a given resistance which would be chronically varied due to its degradation. Therefore, a fourth embodiment of the invention is directed to effectively monitor the abnormality of the automatic laser beam control mechanism in spite of degradation of the detecting resistor so as to prevent abnormal or dangerous laser emission.

Figure 12:
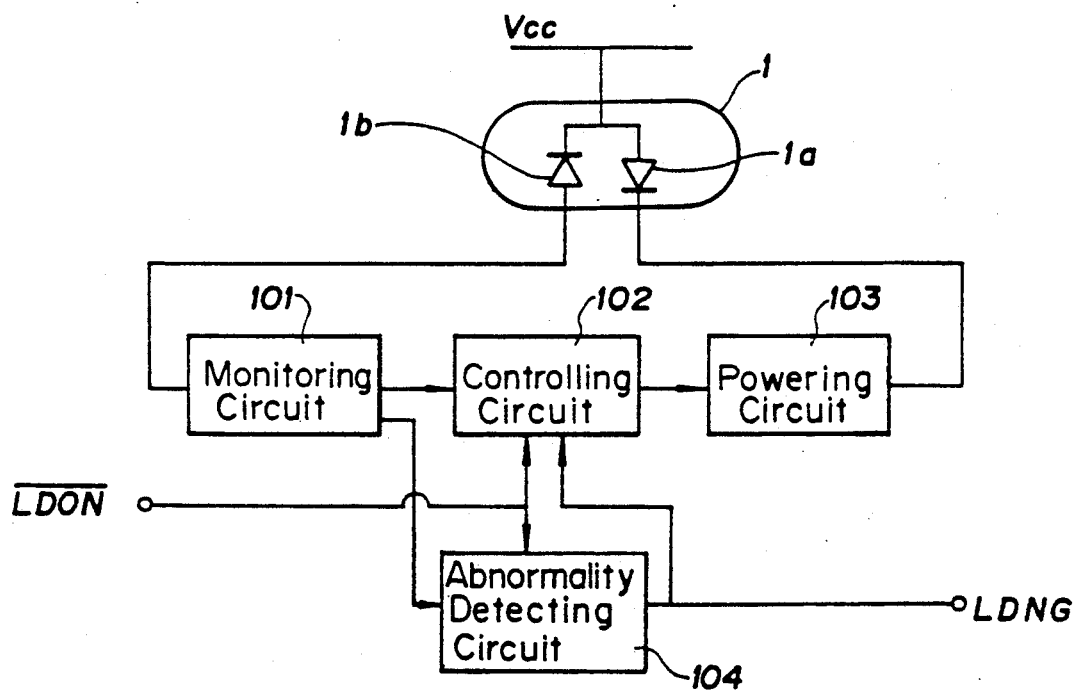
FIG. 12 is a structural block diagram of a fourth embodiment of the semiconductor laser driving circuit.

In order to achieve the purpose, the fourth embodiment of the inventive semiconductor laser driving circuit has a basic structure as shown in FIG. 12. Namely, the semiconductor laser driving circuit is comprised of a laser package 1 containing a semiconductor laser in the form of a laser diode 1a and a photodetector in the form of a photodiode 1b. The photodiode 1b receives a laser beam emitted from the laser diode 1a to effect photo-electric conversion thereof to produce a corresponding electric signal. A monitoring circuit 101 is connected to the photodiode 1b to monitor the electric signal to produce a monitor signal indicative of variation in the laser beam intensity. The monitoring circuit 101 has a first detecting resistor for detecting the electric signal to produce a first monitor signal based on the detection results, and a second detecting resistor connected to the first detecting resistor for producing a second monitor signal correlated to the first monitor signal, based on the detection results. A controlling circuit 102 is connected to the monitoring circuit 101 for comparing the first monitor signal with a predetermined reference signal to produce a control signal according to difference therebetween. A powering circuit 103 is connected to the controlling circuit 102 for applying to the laser diode 1a a drive power according to the control signal so as to regulatively drive the laser diode 1a to cancel or null the difference between the varying first monitor signal and the given reference signal. By such construction, the laser diode 1a, photodiode 1b, monitoring circuit 101, controlling circuit 102 and powering circuit 103 constitute together a servo loop effective to carry out automatic control of the laser beam intensity.

An abnormality detecting circuit 104 is connected to the monitoring circuit 101 for comparing the second monitor signal with a limit signal which is set different than the reference signal so as to detect abnormality to thereby output an abnormality signal LDNG.

In a preferred form, the controlling circuit 102 includes a shutdown circuit responsive to the abnormality signal LDNG to shut down or turn off the laser diode 1a.

In another preferred form, the abnormality detecting circuit 104 is constructed such as to produce an abnormality signal when the second monitor signal falls below a lower limit signal which is set lower than the reference signal and when the second monitor signal exceeds an upper limit signal which is set higher than the reference signal, to indicate occurrence of abnormality of the semiconductor laser driving circuit.

In addition, the monitoring circuit has the pair of first and second detecting resistors series-connected to each other, a first circuit for producing the first monitor signal according to a potential difference developed across the first detecting resistor, and a second circuit for producing the second monitor signal according to a potential difference developed across the second detecting resistor.

According to the fourth embodiment, when abnormality occurs in the laser diode, photodiode or automatic power control servo loop so that the second monitor signal significantly varies relative to the reference signal, an abnormality signal is produced immediately. This abnormality signal is generated, for example, when the laser beam intensity falls or diminishes due to failure or degradation of the laser diode, or when the first monitor signal varies due to failure or breakdown of the photodiode, which would dangerously induce excessive emission of the laser beam through the servo loop.

Particularly, according to the fourth embodiment, the first and second monitor signals are formed by means of the mutually connected pair of detecting resistors. Therefore, when the resistance ratio of the two detecting resistors varies due to chronical degeradation, the second monitor signal for the abnormality detection varies in correlation with the first monitor signal for the automatic laser power control, thereby recognizing abnormality due to the detecting resistors themselves.

Figure 13:
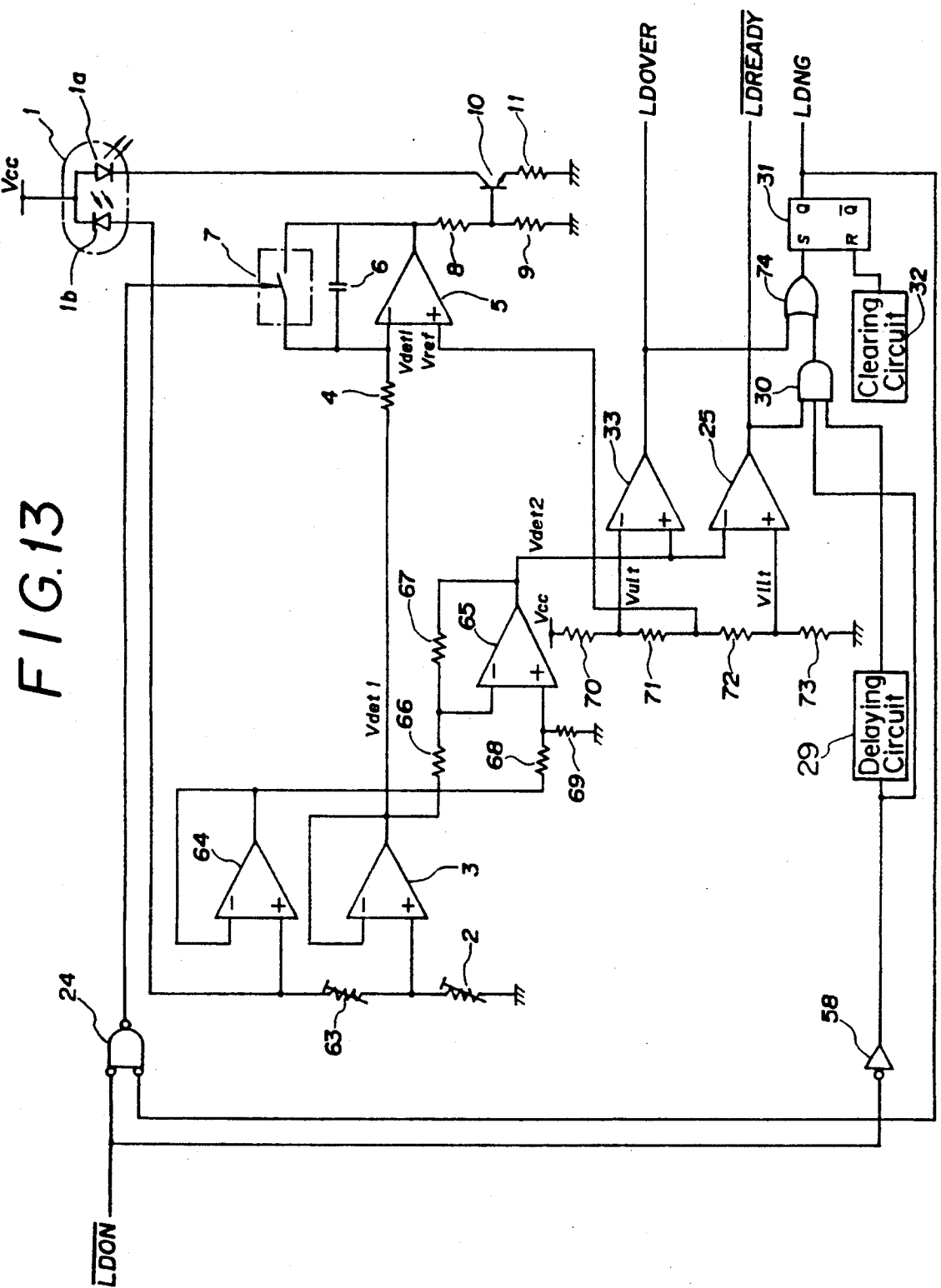
FIG. 13 is a detailed circuit diagram of the fourth embodiment.

Hereinafter, the fourth embodiment of the present invention will be described in detail with reference to the drawings. FIG. 13 is a detailed circuit diagram of the fourth embodiment of the inventive semiconductor laser driving circuit. As shown in the figure, the semiconductor laser driving circuit has a laser package 1 which contains a laser diode 1a. Its anode terminal is connected to a power source line $V_{cc}$. Further, the package 1 contains a photodiode 1b which is connected at its cathode terminal to the same power source line $V_{cc}$.

The semiconductor laser driving circuit is further comprised of a monitoring circuit, a controlling circuit, a powering circuit and an abnormality detecting circuit. The monitoring circuit has a current-voltage conversion resistor or a first detecting resistor 2 operative to convert a photocurrent outputted from the photodiode 1b into a corresponding voltage, and being connected between the anode terminal of the photodiode 1b and the earth line. This variable resistor 2 is connected at its one end to a positive input terminal of a differential amplifier 3, which has a negative input terminal and an output terminal directly coupled to each other. Therefore, the amplifier 3 functions as a buffer to effect impedance conversion to produce a first monitor signal $V_{det1}$ at its output terminal. The first monitor signal has a voltage level proportional to a laser beam intensity received by the photodiode 1b.

The monitoring circuit further includes a variable second detecting resistor 63 connected in series between the photodiode 1b and the first detecting resistor 2. This resistor 63 is connected at its one end to a positive input terminal of a differential amplifier 64 which has a negative input terminal and an output terminal coupled to each other. Therefore, the amplifier 64 operates as a buffer so as to produce at its output terminal a voltage equal to a potential difference across the series-connected pair of the first and second detecting resistors 2 and 63. The amplifier 64 is connected at its output terminal to a positive input terminal of a differential amplifier 65 through voltage-dividing resistors 68 and 69, and the amplifier 3 is connected at its output terminal to a negative input terminal of the same differential amplifier 65 through a voltage-dividing resistor 66. This amplifier 65 has an output terminal coupled to its negative input terminal through a voltage-dividing resistor 67. Therefore, the differential amplifier 65 produces at its output terminal a second monitor signal $V_{det2}$ proportional to a potential difference developed across the second detecting resistor 63. If the voltage-dividing resistors 66, 67, 68 and 69 have the same resistance and the pair of variable detecting resistors 2 and 63 are adjusted to the identical resistance, the first monitor signal $V_{det1}$ and the second monitor signal $V_{det2}$ have the same voltage level.

The control circuit is comprised of an integrating resistor 4, differential amplifier 5, integrating capacitor 6 and analog switch 7. The integrating resistor 4 is connected between the output terminal of the preceding amplifier 3 and a negative input terminal of the succeeding amplifier 5. The integrating capacitor 6 is connected between the negative input terminal and the output terminal of the amplifier 5. Further, the amplifier 5 receives at its positive input terminal a reference signal $V_{ref}$ having a predetermined voltage value. These resistor 4, amplifier 5 and capacitor 6 constitute together an integrating circuit operative to produce a control signal according to difference between the first monitor signal $V_{det1}$ and the reference signal $V_{ref}$. Further, an analog switch 7 is inserted between the negative input terminal and the output terminal of the differential amplifier 5. In addition, the controlling circuit includes a shutdown circuit comprised of an AND gate circuit 24 having a pair of input terminals. The AND gate circuit 24 receives at its one input terminal a start signal $\overline{\text{LDON}}$ effective to initiate powering of the laser diode 1a, and receives at its the other input terminal an abnormality signal LDNG. The AND gate circuit 24 is connected at its output terminal to the analog switch 7 to control conductivity thereof.

The powering circuit is comprised of a pair of voltage-dividing resistors 8 and 9, driving transistor 10 and voltage-current conversion resistor 11. The transistor 10 has a base terminal connected to the output terminal of amplifier 5 through one voltage-dividing resistor 8, a collector terminal connected to a cathode terminal of the laser diode 1a, and an emitter terminal grounded through the resistor 11.

The abnormality detecting circuit has a window pair of comparators 25 and 33. The one comparator 25 receives at its negative input terminal the second monitor signal $V_{det2}$, and receives at its positive input terminal a lower limit signal $V_{llt}$. Series-connected voltage-dividing resistors 70, 71, 72 and 73 are provided to set a voltage level of the lower limit signal $V_{llt}$ lower than that of the reference signal $V_{ref}$. In this embodiment, the lower limit signal $V_{llt}$ is set 5% lower than the reference signal $V_{ref}$. The comparator 25 produces at its output terminal a ready signal $\overline{\text{LDREADY}}$ having a voltage level which can be inverted according to the relative level relation between the second monitor signal $V_{det2}$ and the lower limit signal $V_{llt}$. The abnormality detecting circuit further includes a three-input AND gate circuit 30 having a first input terminal connected to the output terminal of the comparator 25, a second input terminal receptive of the start signal $\overline{\text{LDON}}$ through an inverter 58, and a third input terminal receptive of the start signal $\overline{\text{LDON}}$ through the inverter 58 and a delaying circuit 29. An RS flipflop 31 is connected at its set terminal S to an output terminal of the AND gate circuit 30 through an OR gate circuit 74. Further, a clearing circuit 32 is connected to a reset terminal R of the RS flipflop 31 for resetting the flipflop 31 at the time of turning on the power supply. The flipflop 31 produces the abnormality signal LDNG at its output terminal Q. In the above described embodiment, the AND gate circuit 24 and 30, delaying circuit 29, inverter 58, OR gate circuit 74 and flipflop 31 are comprised of individual circuit elements; however, these components can be functionally integrated in a microcomputer device provided in the semiconductor laser control system.

The other comparator 33 receives at its positive input terminal the second monitor signal $V_{det2}$ and receives at its negative input terminal an upper limit signal $V_{ult}$. This upper limit signal $V_{ult}$ is obtained from an upper end of the second one of the series-connected voltage-dividing resistors 70–73, and the reference signal $V_{ref}$ is obtained from a lower end of the same voltage-dividing resistor 71. Generally, the upper limit signal $V_{ult}$ is 5%–10% higher than the reference signal $V_{ref}$, such that the second monitor signal $V_{det2}$ cannot exceed the upper limit signal $V_{ult}$, in normal operation. The comparator 33 produces an inversion signal LDOVER at its output terminal when the second monitor signal $V_{det2}$ exceeds the upper limit signal $V_{ult}$. The RS flipflop 31 is connected at its set terminal S to the output terminal of the comparator 33 through the OR gate circuit 74. The flipflop 31 latches the inversion signal LDOVER to output the abnormality signal LDON at its output terminal Q.

According to the fourth embodiment, the pair of first and second detecting resistors are utilized to form first and second monitor signals, respectively. The first monitor signal is used for automatic laser power control, and the second monitor signal is used for abnormality detection. The first and second detecting resistors are connected mutually such that when either of the detecting resistors suffers from open defect, short defect or resistance variation due to chronical degradation, the resistance ratio of the pair of detecting resistors varies such that the second monitor signal shifts as well as the first monitor signal. When this shift falls out of the lower or upper limit voltage, the abnormality signal is produced. Therefore, failure of the detecting resistor itself can be detected effectively. Since it would be quite rare that both of the detecting resistors exhibit failure at the same time, the relative resistance change is generally observed between the pair of detecting resistors to judge failure so as to improve the safety performance of the semiconductor laser driving circuit. In the stable state of the operation, the first monitor signal $V_{det1}$ is made equal to the reference voltage $V_{ref}$, and the second monitor signal $V_{det2}$ is also provisionally adjusted to coincide with the reference voltage $V_{ref}$. Therefore, it might be possible to use a common monitor signal for carrying out both of the automatic laser power control and the abnormality detection rather than using separate monitor signals. However, in such case, there would be caused a drawback that abnormality could not be detected when the resistance of the single detecting resistor varies because the level of the monitor signal is held constant by means of the automatic laser power control.

Figure 14:
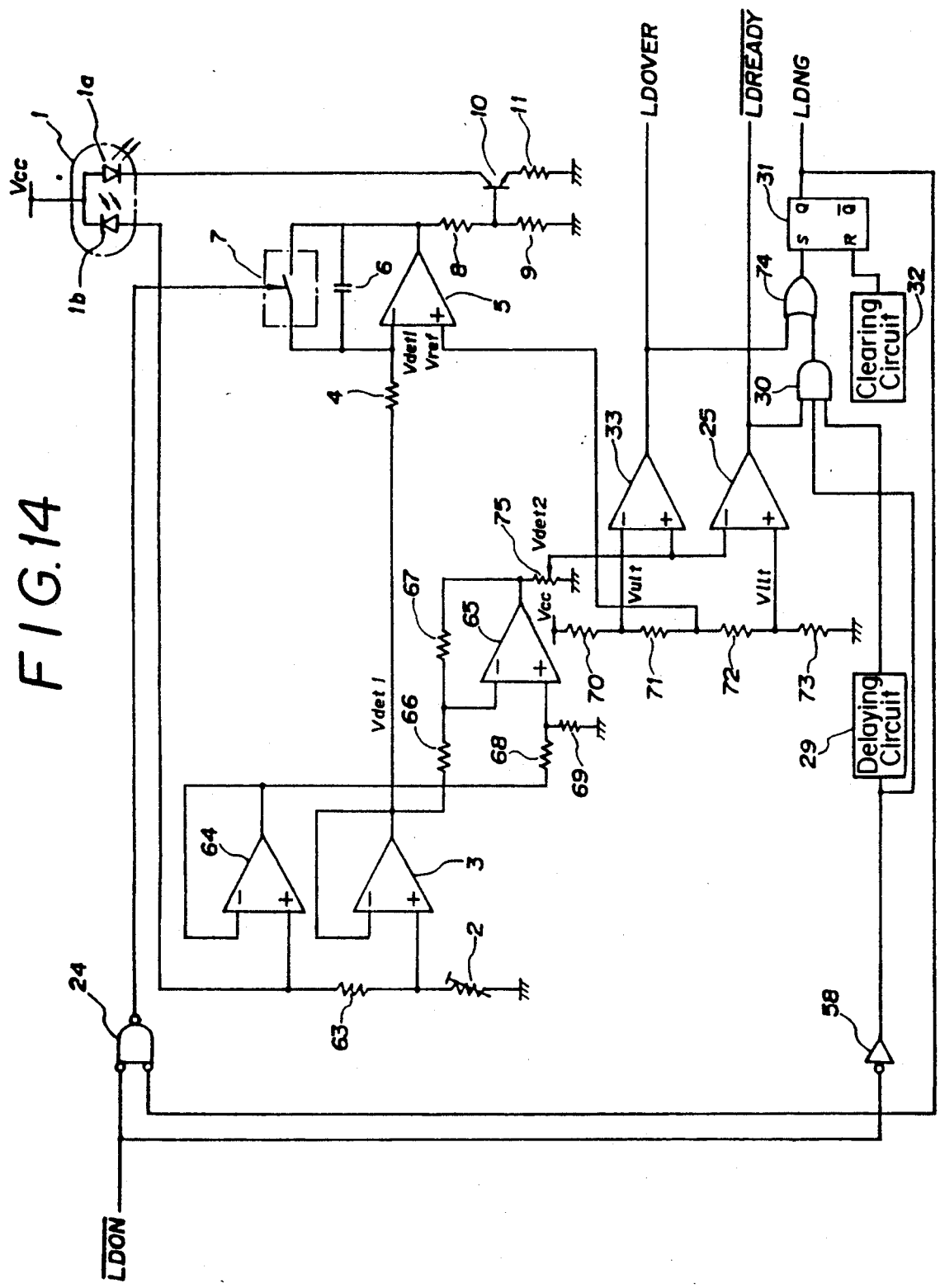
FIGS. 14-16 are detailed circuit diagrams showing variations of the fourth embodiment.

FIG. 14 shows a variation of the fourth embodiment. Hereinafter, the same component is denoted by the same reference numeral as in the FIG. 13 embodiment. Therefore, the description is given for only the different points. In this variation, the second detection resistor 63 is composed of a fixed resistor, and a variable resistor 75 is connected to the output terminal of the differential amplifier 65. The variable resistor 75 is regulated to adjust the standing level of the second monitor signal $V_{det2}$ identical to the reference voltage $V_{ref}$. In this example, the variation of the first detecting resistor of the variable type is checked with reference to the second detecting resistor of the more stable fixed type.

Figure 15:
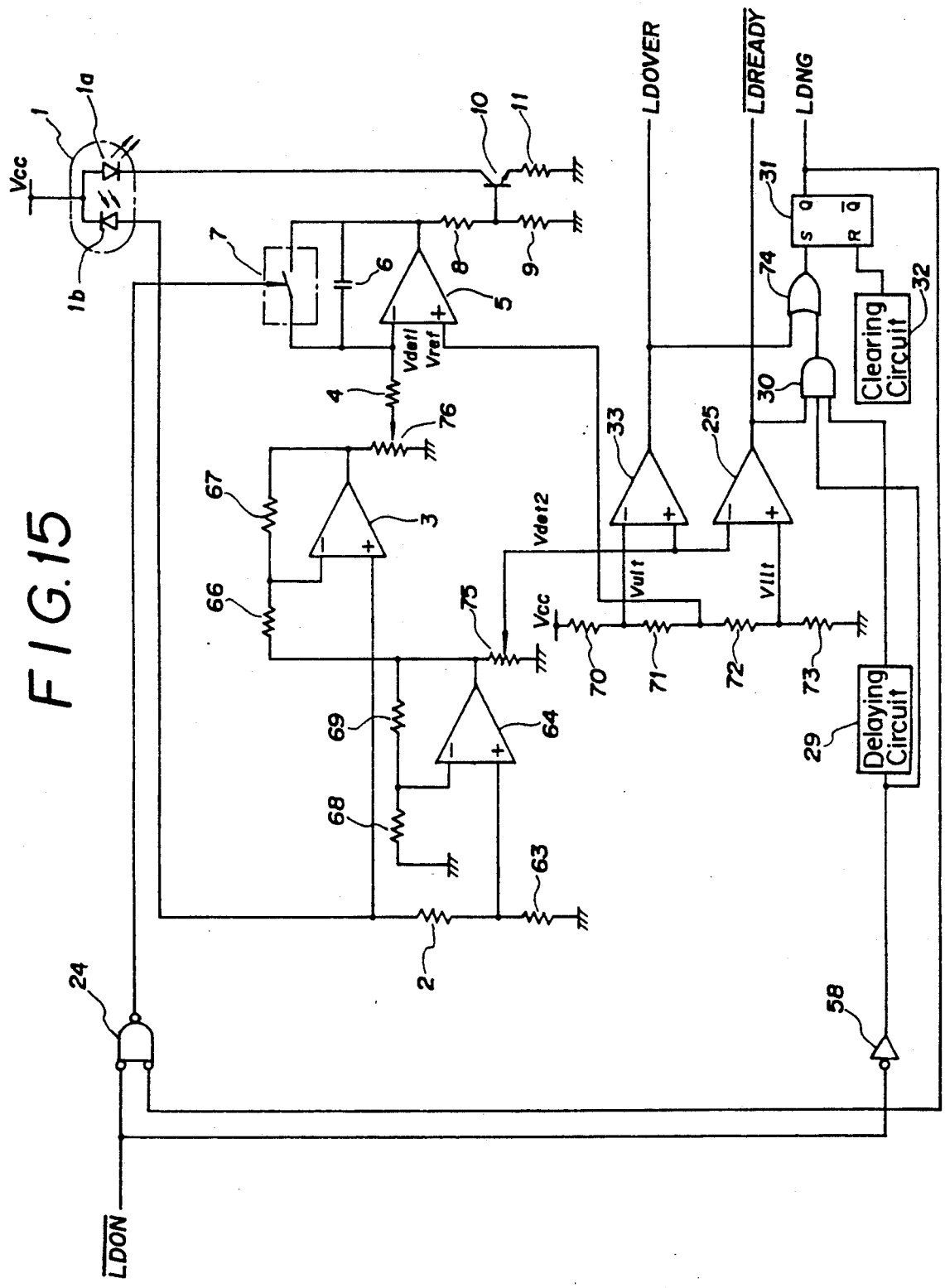

FIG. 15 shows another variation of the fourth embodiment. In this variation, a pair of non-inversion amplifier 3 and 64 are used to constitute respective differential amplifiers to produce the first monitor signal $V_{det1}$ and the second monitor signal $V_{det2}$, respectively. Therefore, an additional differential amplifier 65 can be eliminated as opposed to the previous examples. In this case, the voltage-dividing resistors 66, 67, 68 and 69 preferably have the same resistance. However, if a relative gain is desired between the pair of first and second monitor signals, the pair of resistors 67 and 68 are set to an identical resistance, and the other pair of resistors 66 and 69 are set to another identical resistance. Further in this variation, the pair of detecting resistors 2 and 63 are composed of a fixed resistor, and in turn a variable resistor 76 is connected to an output terminal of the amplifier 3 so as to adjust the first monitor signal $V_{det1}$ to regulate laser beam power, and another variable resistor 75 is connected to an output terminal of the other amplifier 64 so as to effect adjustment of the level or offset of the second monitor signal $V_{det2}$.

Figure 16:
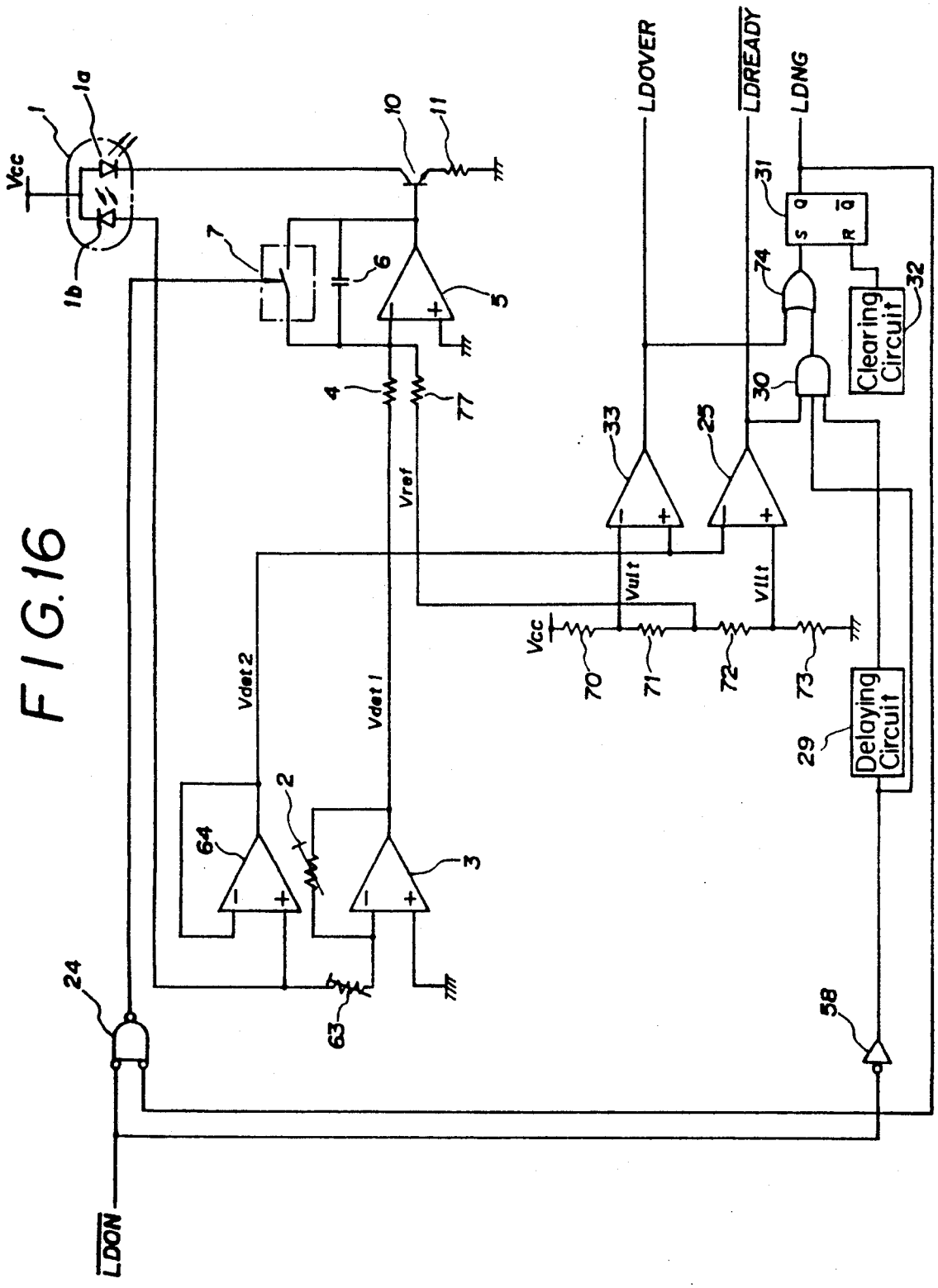

FIG. 16 shows still another variation of the fourth embodiment. While the previous examples are operated by a single power source, this example is constructed to enable use of positive and negative power supplies. The amplifier 3 produces a first monitor signal $V_{det1}$ having a voltage value identical to a voltage drop developed across the first detecting resistor 2 when a photocurrent passes therethrough from the photodiode 1b. The other amplifier 64 outputs a second monitor signal $V_{det2}$ having a voltage value equal to a voltage drop developed across the second detecting resistor 63 when the photocurrent passes through the resistor 63. Accordingly, an additional differential amplifier 65 is not needed as in the just previous example.

Fifth Embodiment

Figure 17:
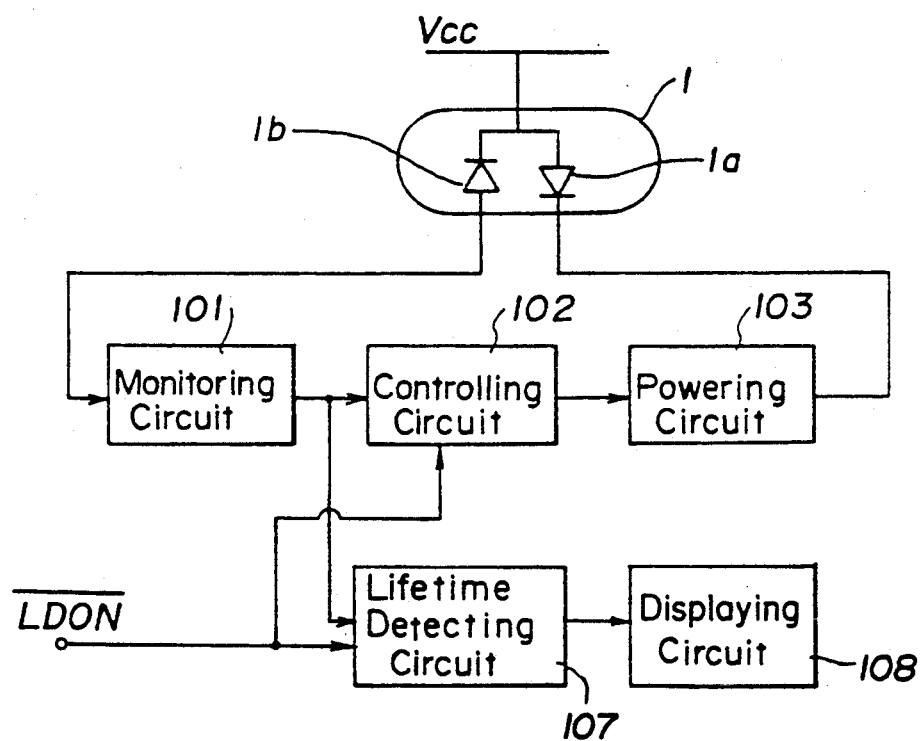
FIG. 17 is a structural block diagram of a fifth embodiment of the semiconductor laser driving circuit.

A fifth embodiment of the inventive semiconductor laser driving circuit has a basic structure as shown in FIG. 17. Namely, the semiconductor laser driving circuit is comprised of a laser package 1 containing a semiconductor laser in the form of a laser diode 1a responsive to a start signal $\overline{\text{LDON}}$ for emitting a laser beam by a drive current, and a photodetector in the form of a photodiode 1b for receiving the emitted laser beam. A monitoring circuit 101 is connected to the photodiode 1b to produce a monitor signal indicative of variation in the laser beam intensity. A controlling circuit 102 is connected to the monitoring circuit 101 for comparing the monitor signal with a predetermined reference signal to produce a control signal according to difference therebetween. A powering circuit 103 is connected to the controlling circuit 102 for applying to the laser diode 1a a drive power or drive current according to the control signal so as to regulatively drive the laser diode 1a to remove or eliminate the difference between the varying monitor signal and the given reference signal. By such construction, the laser diode 1a, photodiode 1b, monitoring circuit 101, controlling circuit 102 and powering circuit 103 constitute together a servo loop effective to carry out automatic control of the laser beam intensity.

Further, a lifetime detecting circuit 107 is connected to the monitoring circuit 101 to detect a rising time of the monitor signal in response to the start signal $\overline{\text{LDON}}$ to output an alarm signal according to a delay amount of the rising time. A displaying circuit 108 is connected to the lifetime detecting circuit 107 to display a degradation degree of the laser diode 1a in response to the alarm signal. Preferably, the lifetime detecting circuit includes a plurality of delaying circuits for stepwise measuring the delay amount of the rising time of the monitor signal from the occurrence of the start signal.

Further preferably, the lifetime detecting circuit includes a comparator for detecting the rising time of the monitor signal when a voltage level of the monitor signal exceeds a given voltage level of a limit signal set lower than a voltage level of the reference signal.

With the progress of time-dependent degradation of the laser diode, more forward drive current is needed to maintain a constant laser beam intensity. Therefore, it takes a longer rising time from the start of the operation of the automatic laser power control mechanism to a certain timing when the laser beam intensity reaches a give level. Therefore, a rising time of the monitor signal is accordingly prolonged. Namely, the rising time of the monitor signal is a parameter indicative of degradation degree or aging of the laser diode. In view of this, the fifth embodiment is constructed such that a delay amount of the monitor signal rising time is monitored to produce an alarm signal to indicate that replacement of the using laser diode is approaching.

Figure 18:
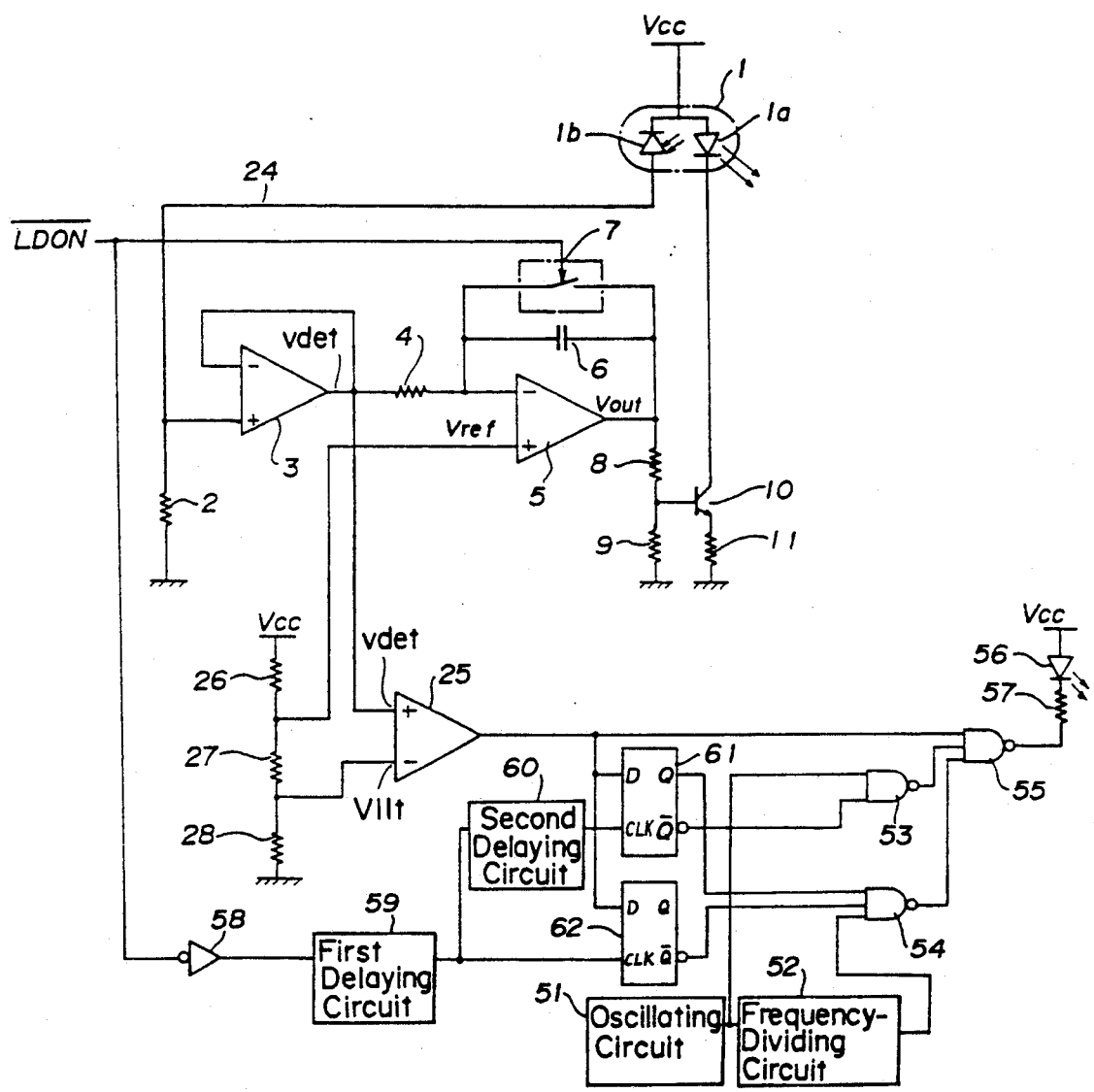
FIG. 18 is a detailed circuit diagram of the fifth embodiment.

Hereinafter, the fifth embodiment of the present invention will be described in detail with reference to the drawings. FIG. 18 is a detailed circuit diagram of the fifth embodiment of the inventive semiconductor laser driving circuit. As shown in the figure, the semiconductor laser driving circuit has, as its characterizing part, a lifetime detecting circuit which is comprised of a comparator 25, three voltage-dividing resistors 26, 27 and 28 series-connected to one another, an inverter 58, a pair of delaying circuits 59 and 60, and a pair of D flipflop circuits 61 and 62. The three voltage-dividing resistors 26, 27 and 28 are connected in series between a power source line $V_{cc}$ and the ground line. The intermediate resistor 27 provides at its upper end the reference voltage $V_{ref}$ which is applied to the positive input terminal of the differential amplifier 5, and provides at its lower end the lower limit voltage $V_{llt}$ which is set lower than the reference voltage $V_{ref}$. The comparator 25 receives at its positive input terminal the monitor voltage $V_{det}$, and receives at its negative input terminal the lower limit voltage $V_{llt}$. By such construction, the comparator 25 operates when the monitor voltage $V_{det}$ exceeds the limit voltage $V_{llt}$ to output an inversion signal effective to detect the rising time of the monitor voltage. The first delaying circuit 59 receives the start signal $\overline{LDON}$ through the inverter 58, and is responsive to a trailing edge of the start signal $\overline{LDON}$ to output a first delay signal having a given delay time of, for example, 400 μs. The second delaying circuit 60 is connected to the first delaying circuit 59, and is responsive to the output of the first delay signal to produce a second delay signal after lapse of a predetermined delay time of, for example, 50 μs. The first D flipflop circuit 62 receives at its CLK input terminal the first delay signal, and receives at its D input terminal the inversion signal. Consequently, the D flipflop circuit 62 operates when the inversion signal occurs after the occurrence of the first delay signal for outputting a first alarm signal at its Q output terminal. The second D flipflop circuit 61 receives the second delay signal at its CLK input terminal, and receives the inversion signal at its D input terminal. Consequently, the second D flipflop circuit 61 operates when the inversion signal is received after the receipt of the second delay signal for outputting a second alarm signal at its Q output terminal.

Further, the semiconductor laser driving circuit is provided with a displaying circuit which is comprised of an oscillating circuit 51, a frequency-dividing circuit 52, three AND gate circuits 53, 54 and 55, a light emitting diode 56 and a resistor 57. The AND gate circuit 54 has three input terminals which are connected, respectively, to the frequency-dividing circuit 52, the Q output terminal of the first D flipflop circuit 62, and the Q output terminal of the second D flipflop circuit 61. The AND gate circuit 53 has two input terminals which are connected, respectively, to the oscillating circuit 51, and the $\overline{Q}$ output terminal of the second D flipflop circuit 61. The AND gate circuit 55 has three input terminals which are connected, respectively, to the output terminal of the comparator 25, an inverted output terminal of the AND gate circuit 53, and an inverted output terminal of the AND gate circuit 54. The light emitting diode 56 has an anode terminal connected to the power supply line $V_{cc}$ and a cathode terminal connected through the resistor 57 to an inverted output terminal of the AND gate circuit 55. The oscillating circuit 51 produces a display signal having a given frequency of, for example, 2 Hz, and the frequency-dividing circuit 52 frequency-divides the 2 Hz display signal to produce another display signal having a frequency of 1 Hz.

Figure 19:
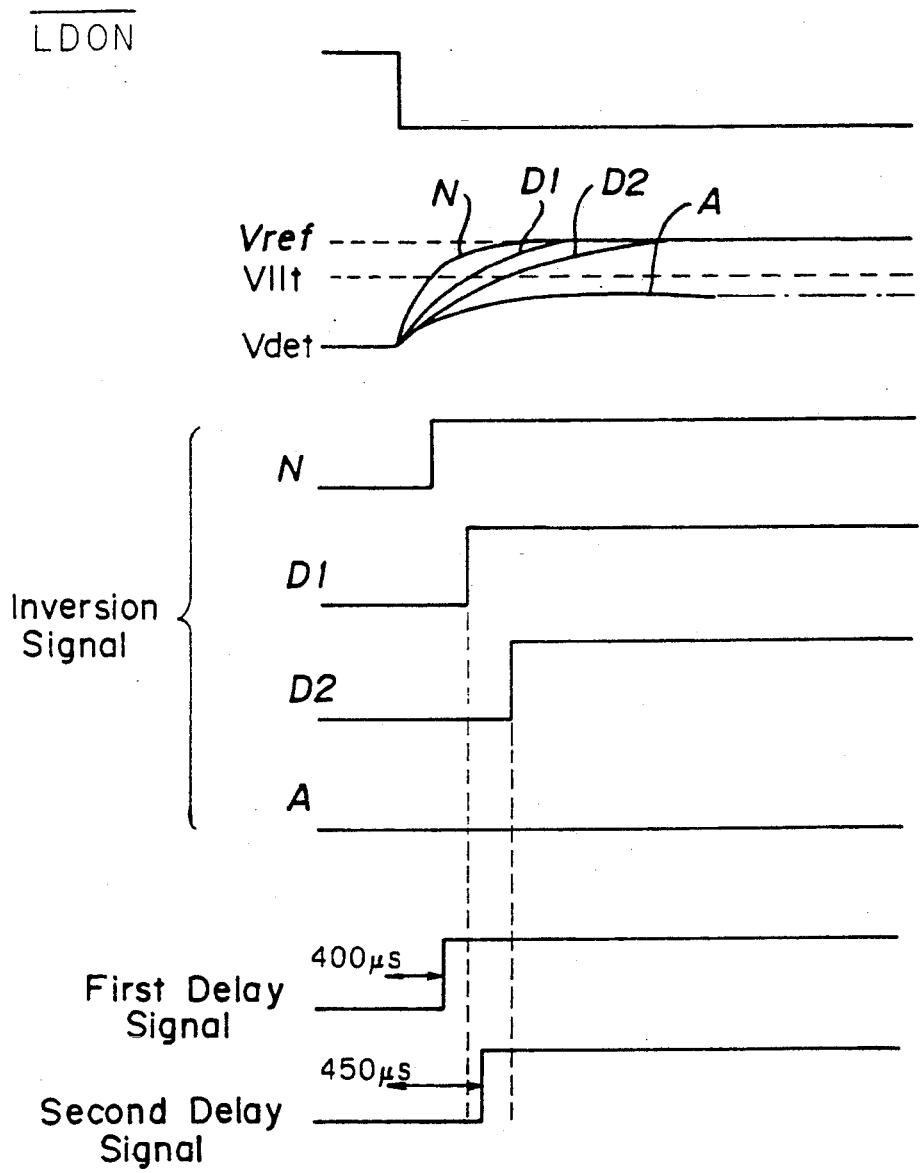
FIG. 19 is a timing chart showing the lifetime detecting operation of the fifth embodiment.

Next, the lifetime detecting operation is described with reference to the lifetime detection timing chart shown in FIG. 19. When the start signal $\overline{LDON}$ switches from the high level to the low level to turn on the laser diode 1a, the laser beam intensity gradually rises to reach the stable state while the integrating capacitor 6 is being charged by means of the automatic laser power control mechanism. Therefore, the monitor voltage $V_{det}$ also rises from the switching of the start signal $\overline{LDON}$ correspondingly to the laser beam intensity change to thereby reach the level of the reference voltage $V_{ref}$. In case that the laser diode 1a suffers from time-dependent degradation or aging, the emission efficiency is reduced so that the automatic laser power control mechanism operates to compensate for the reduction of the emission efficiency to increase the forward drive current. Accordingly, charging amount of the integrating capacitor 6 increases to thereby prolong the rising time of the monitor voltage $V_{det}$. In case that the laser diode has no degradation or slight degradation, a rising curve N of the monitor voltage is relatively sharp. In case that the aging progresses to a moderate degree, a rising curve D1 of the monitor voltage becomes dull. In case that the aging progresses extremely, a rising curve D2 of the monitor voltage is further made dull. Then, in case that degradation failure occurs lastly, a rising curve A of the monitor voltage cannot exceed the lower limit voltage $V_{llt}$ which is set lower than the reference voltage $V_{ref}$, because the automatic laser power control mechanism does not work normally any more.

The comparator 25 operates at the time when the rising curve of the monitor voltage $V_{det}$ crosses the limit voltage $V_{llt}$ for switching its output inversion signal from the low level to the high level. As understood from the timing chart, the switching timing of the inversion signal is delayed as the aging of the laser diode progresses. Then, when degradation failure occurs, the inversion signal is never changed and therefore is held in the low level. The thus detected rising time of the monitor voltage by means of the comparator 25 is measured by the pair of D flipflop circuits 61 and 62. Namely, when an inversion signal D1 is inputted into the first D flipflop circuit 62 after the first delay signal having 400 μs of delay time relative to the switching of the start signal $\overline{LDON}$ is inputted into the CLK input terminal thereof, the D flipflop circuit 62 produces a first alarm signal. This first alarm signal indicates that the aging of the laser diode progresses to a certain degree. Further, the second D flipflop circuit 61 is designed to accept an inversion signal after its CLK input terminal receives the second delay signal which is delayed further from the first delay signal. Therefore, the second D flipflop circuit 61 operates to latch an inversion signal D2 to output the second alarm signal. Namely, the second alarm signal indicates that the aging of the laser diode progresses seriously or extremely.

The AND gate circuit 54 is made open when the first alarm signal is inputted thereto, so that the display signal having 1 Hz of frequency is applied to the light emitting diode 56 through the AND gate circuit 55. Consequently, the light emitting diode 56 flashes at 1 Hz of frequency. Then, when the second alarm signal is outputted from the flipflop circuit 61, the AND gate circuit 53 is made open so that the other display signal having 2 Hz of frequency is applied through the AND gate circuit 55 to the light emitting diode 56. Consequently, the light emitting diode 56 flashes at 2 Hz to alarm that the laser diode is in the last age thereof. If the monitor voltage $V_{det}$ fails to reach the lower limit voltage $V_{llt}$, the inversion signal is not changed so that the AND gate 55 is closed, and therefore the light emitting diode 56 is turned off, thereby indicating that the laser diode is broken down. As understood from the above description, the displaying circuit starts to carry out slow flashing of the light emitting diode 56 to indicate that the laser diode should be replaced, and subsequently to carry out fast flashing to indicate that the laser diode will be soon disabled.

SIXTH EMBODIMENT

Figure 20:
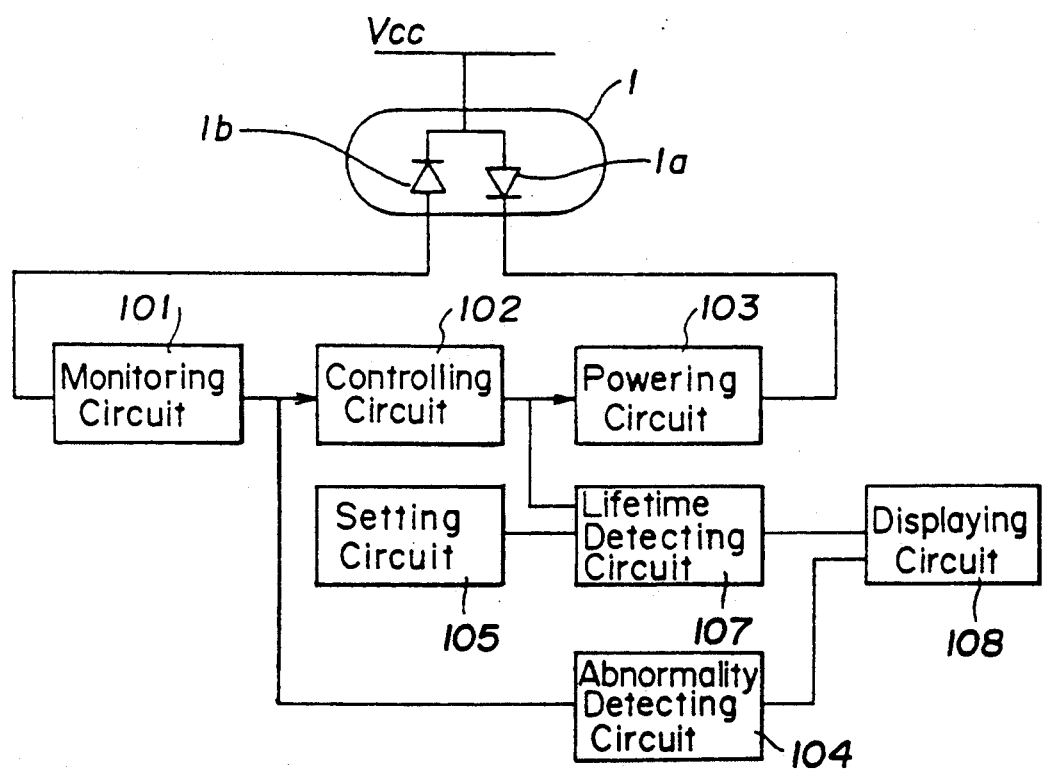
FIG. 20 is a structural block diagram of a sixth embodiment of the semiconductor laser driving circuit.

In similar manner to the previous fifth embodiment, a sixth embodiment of the invention is directed to provide an alarm indicative of apparoaching replacement time of the semiconductor laser before the automatic laser power control falls unable due to aging of the semiconductor laser. In order to achieve the purpose, the sixth embodiment of the inventive semiconductor laser driving circuit has a basic structure as shown in FIG. 20. Namely, the semiconductor laser driving circuit is comprised of a laser package 1 containing a semiconductor laser in the form of a laser diode 1a responsive to a start signal for emitting a laser beam by a drive current, and a photodetector in the form of a photodiode 1b for receiving the emitted laser beam. A monitoring circuit 101 is connected to the photodiode 1b to produce a monitor signal indicative of variation in the laser beam intensity. A controlling circuit 102 is connected to the monitoring circuit 101 for comparing the monitor signal with a predetermined reference signal to produce a control signal having an output voltage according to difference therebetween. A powering circuit 103 is connected to the controlling circuit 102 for applying to the laser diode 1a a drive power or drive current according to the output voltage so as to regulatively drive the laser diode 1a to remove or eliminate the difference between the varying monitor signal and the given reference signal. By such construction, the laser diode 1a, photodiode 1b, monitoring circuit 101, controlling circuit 102 and powering circuit 103 constitute together a servo loop effective to carry out automatic control of the laser beam intensity.

The sixth embodiment of the semiconductor laser driving circuit further includes a setting circuit 105. The setting circuit 105 sets a given threshold voltage between a stable level of the output voltage and a critical level thereof at which the servo loop cannot follow variation of the laser power. A lifetime detecting circuit 107 compares the output voltage of the controlling circuit 102 with the set threshold voltage to produce an alarm signal when the output voltage exceeds the threshold voltage and therefore when it approaches the critical voltage. A displaying circuit 108 is connected to the lifetime detecting circuit 107 for displaying the fact that the laser diode 1a approaches the end of its life span visually or audially in response to the alarm signal.

In a preferred form, the setting circuit sets different levels of threshold voltages stepwise, and the lifetime detecting circuit time-sequentially produces different alarm signals according to the stepwise set threshold voltages. Such construction enables time-sequential alarming indicative of degradation degree of the laser diode.

Further, preferably the semiconductor laser driving circuit includes an abnormality detecting circuit 104 operative to compare the monitor voltage with a lower limit voltage set lower than the reference voltage for controlling the displaying circuit to indicate that the laser diode lastly ends its lifetime when the monitor voltage falls below the lower limit voltage.

According to the sixth embodiment, the lifetime detecting circuit operates to compare the output voltage of the controlling circuit with the threshold voltage so as to monitor degradation degree of the laser diode 1a to produce an alarm signal according to the degradation degree. Therefore, seriously degradated laser diode 1a can be replaced before the automatic laser power control mechanism loses its normal function in the semiconductor laser driving circuit, thereby enabling continuous use of the device containing the laser diode.

Figure 21:
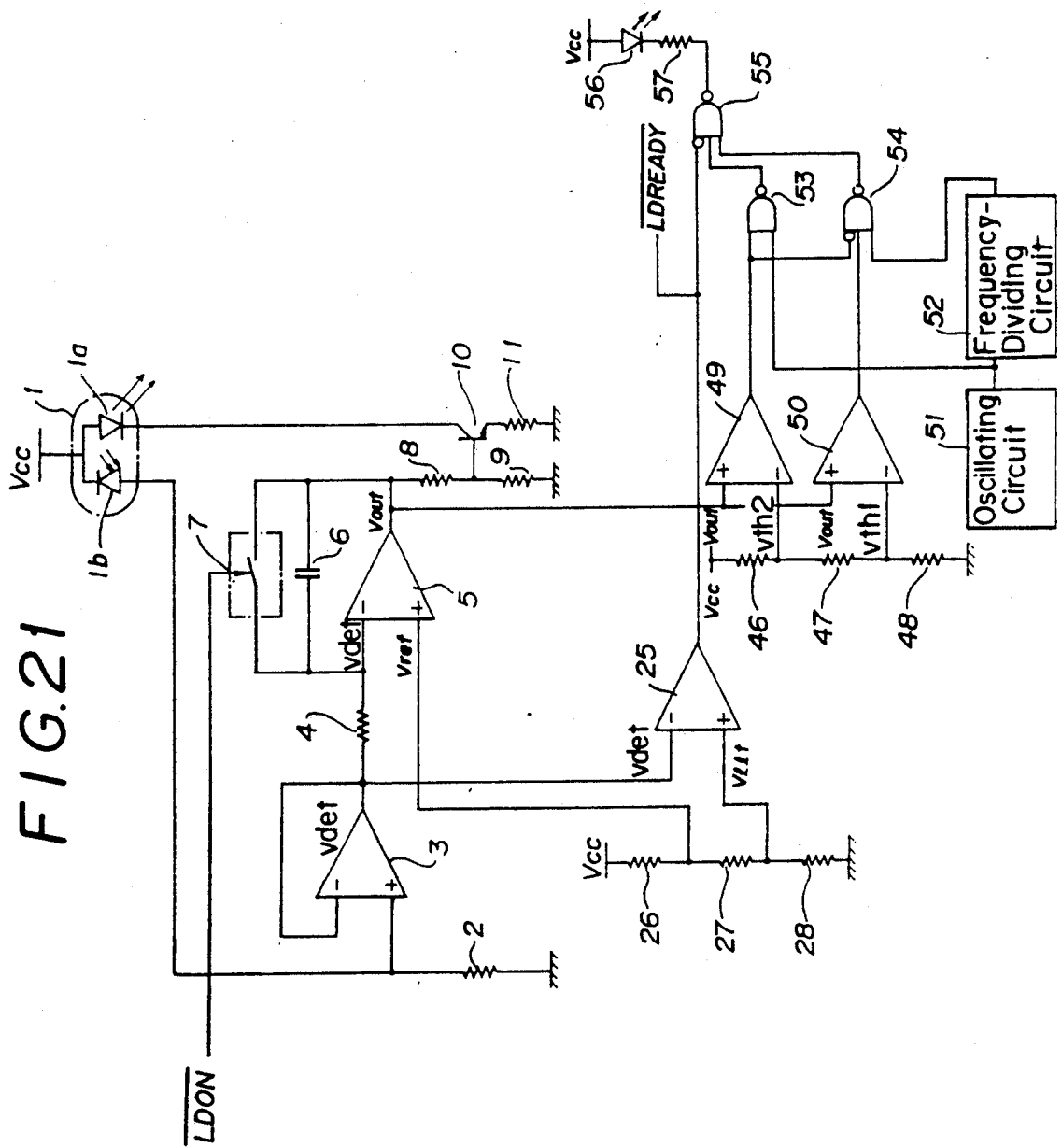
FIG. 21 is a detailed circuit diagram of the sixth embodiment.

Hereinafter, this sixth embodiment will be described in detail with reference to the drawings. FIG. 21 is a detailed circuit diagram of the sixth embodiment of the inventive semiconductor laser driving circuit. As shown in the figure, the semiconductor laser driving circuit has, as its characterizing part, a setting circuit and a lifetime detecting circuit. The setting circuit is comprised of three voltage-dividing resistors 46, 47 and 48 series-connected between the power supply line $V_{cc}$ and the earth line. The intermediate voltage-dividing resistor 47 develops a first threshold voltage $V_{th1}$ at its lower end, and develops a second threshold voltage $V_{th2}$ at its upper end. Either of the threshold voltages is set between the stable level and the critical level of the output voltage $V_{out}$, and the second threshold voltage $V_{th2}$ is closer to the critical level than the first threshold voltage $V_{th1}$. In this embodiment, the threshold voltage is set in two steps; however this step number is not limitative.

The lifetime detecting circuit is comprised of a first comparator 50 and a second comparator 49. The first comparator 50 has a negative input terminal receptive of the first threshold voltage $V_{th1}$, and a positive input terminal receptive of the output voltage $V_{out}$. Accordingly, the comparator 50 produces a first alarm signal at its output terminal when the output voltage exceeds the first threshold voltage. The second comparator 49 has a negative input terminal receptive of the second threshold voltage $V_{th2}$, and a positive input terminal receptive of the output voltage $V_{out}$. Therefore, the comparator 49 porduces a second alarm signal at its output terminal when the output voltage $V_{out}$ exceeds the second threshold voltage $V_{th2}$. The displaying circuit is comprised of an oscillating circuit 51, a frequency-dividing circuit 52, three AND gate circuit 53, 54 and 55, a light emitting diode 56 and a resistor 57 in manner similar to the fifth embodiment.

The semiconductor laser driving circuit further includes an abnormality detecting circuit. This circuit is comprised of voltage-dividing resistors 26, 27 and 28 series-connected between the power supply line $V_{cc}$ and the earth line, and a comparator 25. The comparator 25 has a positive terminal receptive of a lower limit voltage $V_{llt}$ developing at the lower end of the voltage-dividing resistor 27, and a negative input terminal receptive of the monitor voltage $V_{det}$. In addition, the voltage-dividing resistor 27 provides at its upper end the reference voltage $V_{ref}$ which is applied to the positive input terminal of the differential amplifier 5 as described before. Accordingly, the lower limit voltage $V_{llt}$ is set lower than the reference voltage $V_{ref}$ such that the monitor voltage $V_{det}$ cannot falls below the lower limit voltage in the normal state. The comparator 25 produces at its output terminal a state signal $\overline{\text{LDREADY}}$ which is inverted when the monitor voltage $V_{det}$ falls below the lower limit voltage $V_{llt}$ due to failure of the laser diode 1a. The state signal $\overline{\text{LDREADY}}$ is fed to the inverted input terminal of the AND gate circuit 55 so as to turn on the light emitting diode 56 in the normal state and to turn off the light emitting diode 56 in the abnormal state.

Figure 22:
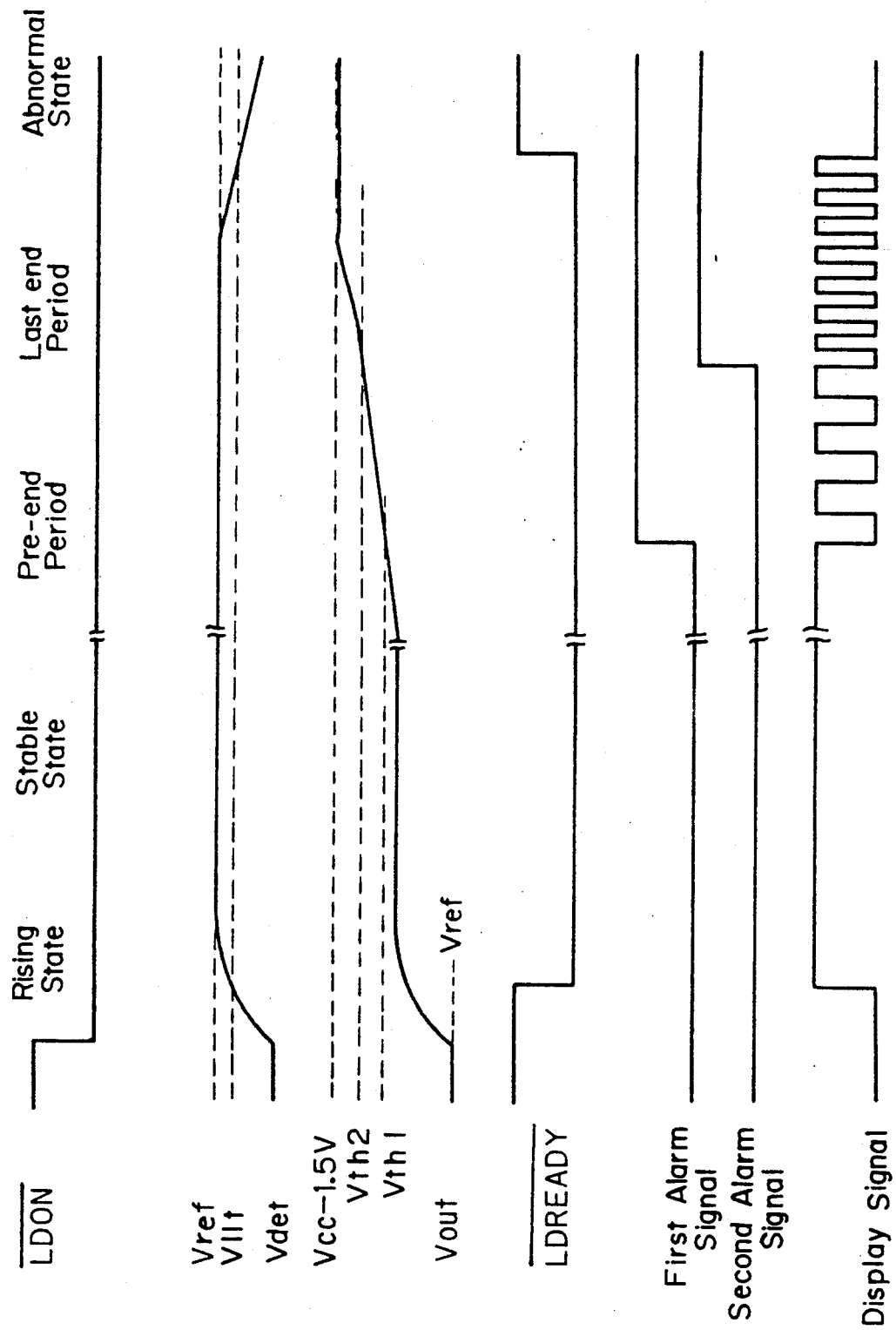
FIG. 22 is a timing chart showing the operation of the sixth embodiment.

Next, the operation of the sixth embodiment of the semiconductor laser driving circuit is described with reference to the FIG. 22 timing chart. This timing chart shows change of various signals time-sequentially. The rising state refers to emission start interval of the laser diode, and the stable state refers to a certain period in which the laser diode exhibits substantially no degradation or quite small degradation. The lifetime pre-end period refers to a period where the degradation of the semiconductor laser diode progresses to considerable degree, and the lifetime last end period refers to a period where the degradation of the laser diode progresses to serious degree. The abnormal state refers to a period in which the laser diode suffers from failure so that the automatic laser power control mechanism no longer works.

Firstly with regard to the automatic light power control operation, when the low-active start signal $\overline{\text{LDON}}$ is turned to low level, the analog switch 7 is made nonconductive so that the controlling circuit and the powering circuit start to operate to apply a forward drive current to the laser diode 1a. Concurrently, the laser diode 1a is activated to emit laser beam, and the photodiode 1b starts to produce a photocurrent proportionally to the laser beam intensity. This photocurrent is converted into a corresponding voltage by means of the current-voltage conversion resistor 2. The amplifier 3 effects impedance conversion with respect to the corresponding voltage to produce a monitor signal in the form of a monitor voltage $V_{det}$ at its output terminal. The integrator composed of integrating resistor 4, differential amplifier 5 and integrating capacitor 6 operates such that the integrating capacitor 6 is charged and discharged regulatively according to the voltage difference between the reference voltage $V_{ref}$ applied to the positive input terminal of the differential amplifier 5 and the monitor voltage $V_{det}$ applied to the negative input terminal thereof. Consequently, the amplifier 5 produces at its output terminal a control signal having an output voltage $V_{out}$ according to that voltage difference. This output voltage $V_{out}$ is divided by the pair of resistors 8 and 9. The divided voltage is converted into the forward drive current by means of the driving transistor 10 to drive the laser diode 1a. This forward drive current is applied to the laser diode 1a so as to remove or eliminate the voltage difference between the varying monitor signal and the constant reference signal. Therefore, in the stable state, the voltage level $V_{det}$ of the monitor signal is held equal to the reference voltage $V_{ref}$ such that the laser beam intensity can be automatically controlled constant in spite of variation in the ambient temperature and moderate degradation of the laser diode. Concurrently, the output voltage $V_{out}$ of the differential amplifier 5 is also held at the stable level. On the other hand, when the start signal $\overline{\text{LDON}}$ is returned from the low level, the analog switch 7 is made conductive so that electric charge stored in the capacitor 6 is totally discharged. Consequently, the output voltage $V_{out}$ of the control signal is made equal to the reference voltage $V_{ref}$. The resistance ratio of the dividing resistors 8 and 9 is set such that the pair of resistors 8 and 9 divide the output voltage $V_{out}$ which is equalized to the reference voltage to produce a divided voltage effective to turn off the driving transistor 10 to thereby shut down the laser diode 1a.

Next, the description is given for the lifetime detecting operation. As indicated by the lifetime pre-end period and the lifetime last end period, when degradation of the laser diode 1a progresses, more forward drive current is needed so that the output voltage $V_{out}$ of the differential amplifier 5 rises gradually. Then at the lifetime pre-end period, the output voltage $V_{out}$ exceeds the first threshold voltage $V_{th1}$ so that the first comparator 50 produces at its output terminal the first alarm signal which is inverted from the low level to the high level. Consequently, the 1 Hz display signal is applied through the AND gate circuits 54 and 55 to the light emitting diode 56, which therefore carries out flashing display of 1 Hz to indicate that the laser diode enters the lifetime pre-end period. When the laser diode is continuously used in this period, the output voltage $V_{out}$ rises further to exceed the second threshold voltage $V_{th2}$ in the lifetime last end period. At this time, the second comparator 49 produces at its output terminal the second alarm signal which is inverted from the low level to the high level. Consequently, the 2 Hz display signal is applied through the AND gate circuits 53 and 55 to the light emitting diode 56, which therefore carries out 2 Hz flashing display to indicate that the laser diode enters the last end period of the lifetime. By such operation, the light emitting diode 56 is controlled to display slow flashing to indicate need for replacement of the laser diode, and to display fast flashing which indicates that the laser diode will be soon broken down.

If the laser diode is still continuously used in the last end period of the lifetime, the output voltage $V_{out}$ further rises to the critical voltage level which is normally in the order of $V_{cc}-1.5$ V. Then, the automatic laser power control mechanism fails to work normally to develop the abnormal state. Consequently, the monitor voltage $V_{det}$ deviates from the reference voltage level $V_{ref}$ to fall below the lower limit voltage level $V_{llt}$. Accordingly, the state signal $\overline{\text{LDREADY}}$ developed at the output terminal of the comparator 25 is inverted from the low level to the high level to thereby turn off the light emitting diode 56, which shows that the laser diode is disabled. Aside from this, when the monitor voltage $V_{det}$ rises to exceed the lower limit voltage $V_{llt}$ in the initial rising state, the state signal $\overline{\text{LDREADY}}$ is switched from the high level to the low level. Accordingly, the light emitting diode 56 is turned on after the passage of the rising state. Namely, as long as the light emitting diode 56 is held in emission state, there is indicated the fact that degradation of the laser diode does not occur.

Seventh Embodiment

In a seventh embodiment, the semiconductor laser driving circuit includes at least two inhibiting circuits operative independently of each other. Therefore, even if a particular inhibiting circuit is broken down, the remaining inhibiting circuit operates to stop emission of the semiconductor laser immediately in response to an inhibition signal.

Figure 23:
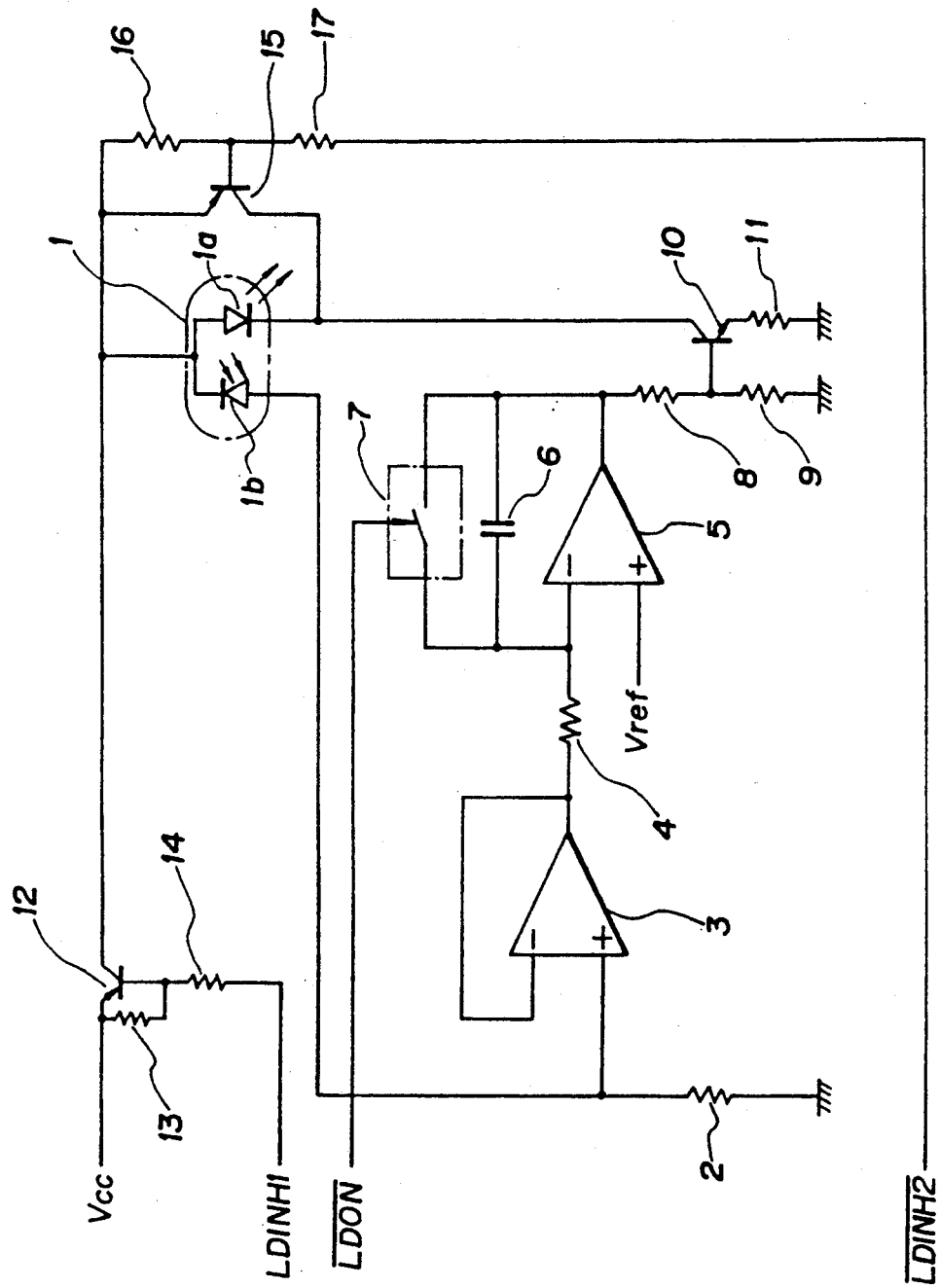
FIG. 23 is a circuit block diagram of a seventh embodiment of the semiconductor laser driving circuit.

Hereinafter, the seventh embodiment of the present invention will be described in detail with reference to the drawings. FIG. 23 is a detailed circuit diagram of the seventh embodiment. As shown in the figure, the semiconductor laser driving circuit has a laser package 1 which contains a semiconductor laser such as a laser diode 1a for emitting a laser beam. Further, the package 1 contains a PIN photodiode 1b for monitoring the emitted laser beam intensity.

The semiconductor laser driving circuit further includes a current supplying circuit responsive to a start signal $\overline{\text{LDON}}$ for supplying a drive current to the laser diode 1a to effect laser emission, a first inhibiting circuit responsive to a first inhibition signal LDINH1 for inhibiting supply of the drive current to the laser diode 1a to effect forcibly shutdown, and a second inhibiting circuit operative independently from the first inhibiting circuit and responsive to a second inhibition signal LDINH2 for inhibiting supply of the drive current to the laser diode 1a to effect forcibly shutdown. The current supplying circuit includes an automatic laser power controlling circuit for effecting automatic control of the drive current in order to maintain the constant laser beam intensity from the laser diode 1a. The construction thereof is similar to the previous embodiments.

The first inhibiting circuit has a current blocking transistor 12 having an emitter terminal connected to the power supply line V. ., a collector terminal connected to an anode terminal of the laser diode 1a, and a base terminal receptive of the first inhibition signal LDINH1 through a resistor 14. Another resistor 13 is connected between the emitter terminal and the base terminal.

The second inhibiting circuit includes a current bypassing transistor 15 having an emitter terminal connected to the anode terminal of the laser diode 1a, a collector terminal connecte to a cathode of the laser diode 1a, and a base terminal receptive of the second inhibition signal LDINH2 through a resistor 17. Another transistor 16 is connected between the base terminal and the emitter terminal of the transistor 15. The resistors 16 and 17 are responsive to the second inhibition signal LDINH2 for driving the current bypassing transistor 15.

Next, the description is given for the inhibiting operation of the FIG. 23 semiconductor laser driving circuit. Firstly, the description is given for the operation of the first inhibiting circuit. In the normal state, the first inhibition signal LDINH1 is held at a low level so that the transistor 12 is held conductive to supply a drive current from the power source line V. . to the laser diode 1a. However, when abnormal or emergent state occurs, the first inhibition signal LDINH1 is changed to a high level. Consequently, the transistor 12 is turned to the nonconductive state so that the drive current is blocked from the laser diode 1a. Therefore, the laser diode 1a is forcibly shut down while the start signal $\overline{\text{LDON}}$ is issued.

Next, the description is given for the operation of the second inhibiting circuit. In the normal state, the second inhibition signal LDINH2 is held at a high level so that the transistor 15 is placed in the nonconductive state. Therefore, a forward voltage is applied to the laser diode 1a to drive normally the same. However, when abnormality or emergency occurs, the second inhibition signal LDINH2 is changed to the low level to thereby place the transistor 15 in the conductive state. Consequently, the applied voltage becomes lower than the forward voltage between the anode terminal and the cathode terminal of the laser diode 1a, hence the drive current is bypassed from the power source line V. . to the transistor 15 to thereby forcibly place the laser diode in the shutdown state. The second inhibition signal LDINH2 may be inverted concurrently with the first inhibition signal LDINH1 from the same cause of abnormality, or they may be inverted independently from each other from different causes of abnormality. As described above, the present embodiment has two different channels to enable forcible shutdown in addition to the regular channel to turn off the laser diode by means of the signal $\overline{\text{LDON}}$. Therefore, even if two of the three channels are concurrently broken down, the remaining channel is still effective to shut down the laser diode to thereby ensure the safety performance. The respective channels are electrically independent from one another, hence they rarely broken down concurrently.

Figure 24:
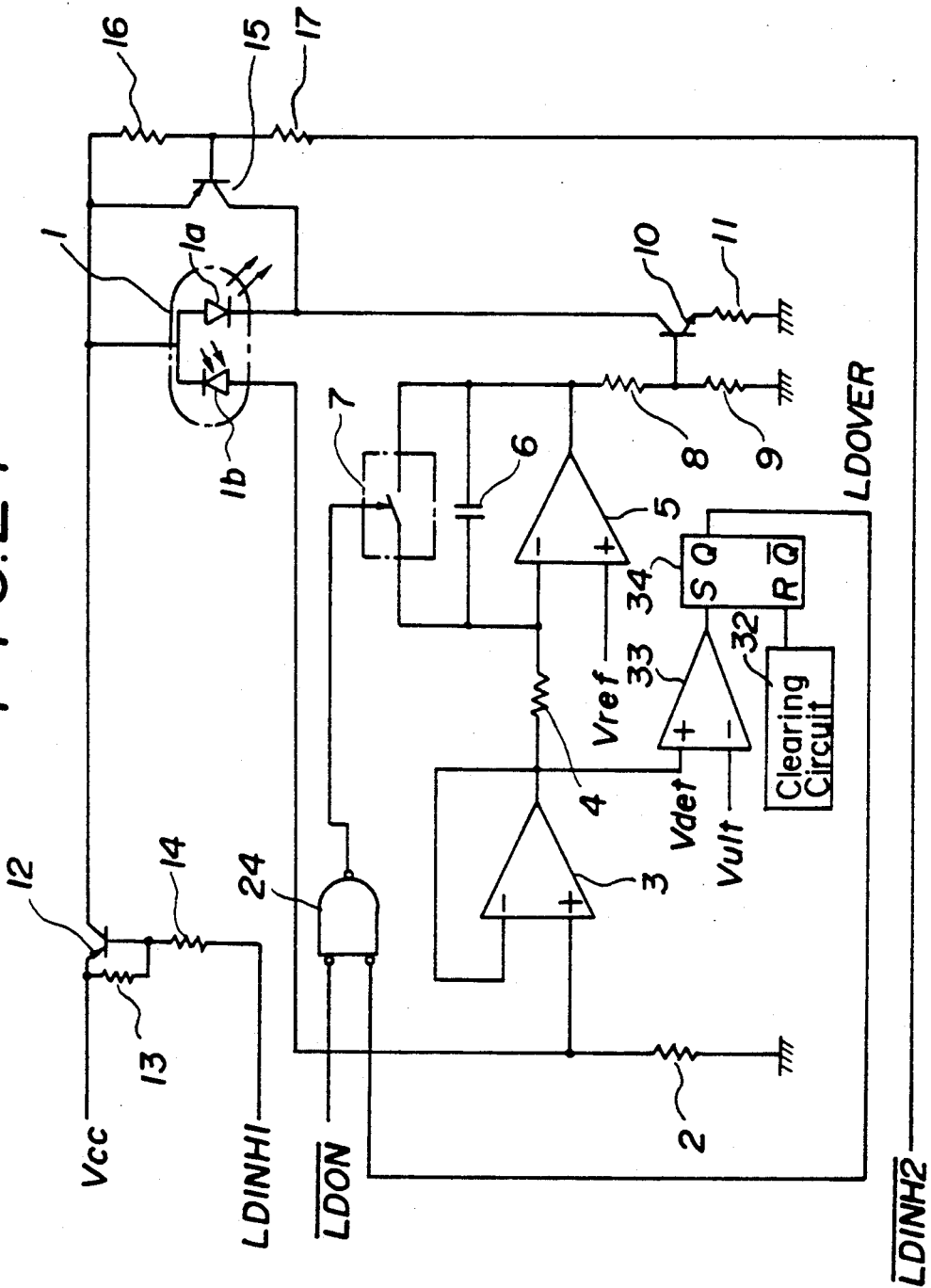
FIGS. 24 and 25 are circuit block diagrams of different variations of the seventh embodiment.

FIG. 24 shows a variation of the seventh embodiment of the inventive semiconductor laser driving circuit. In FIG. 24, the same component is denoted by the same reference numeral as in the FIG. 23 embodiment to facilitate the understanding of the present variation. The present variation is provided with an abnormality detecting circuit comprised of a comparator 33, a flip-flop 34, and a clearing circuit 32. This abnormality detecting circuit operates in manner similar to the second embodiment. Namely, when an abnormality signal LDOVER is outputted internally, the analog switch 7 is turned on through an AND gate circuit 24 so as to shut down the laser diode 1a. This shutdown circuit is separated from the first and second inhibiting circuits responsive to externally inputted inhibition signals.

Figure 25:
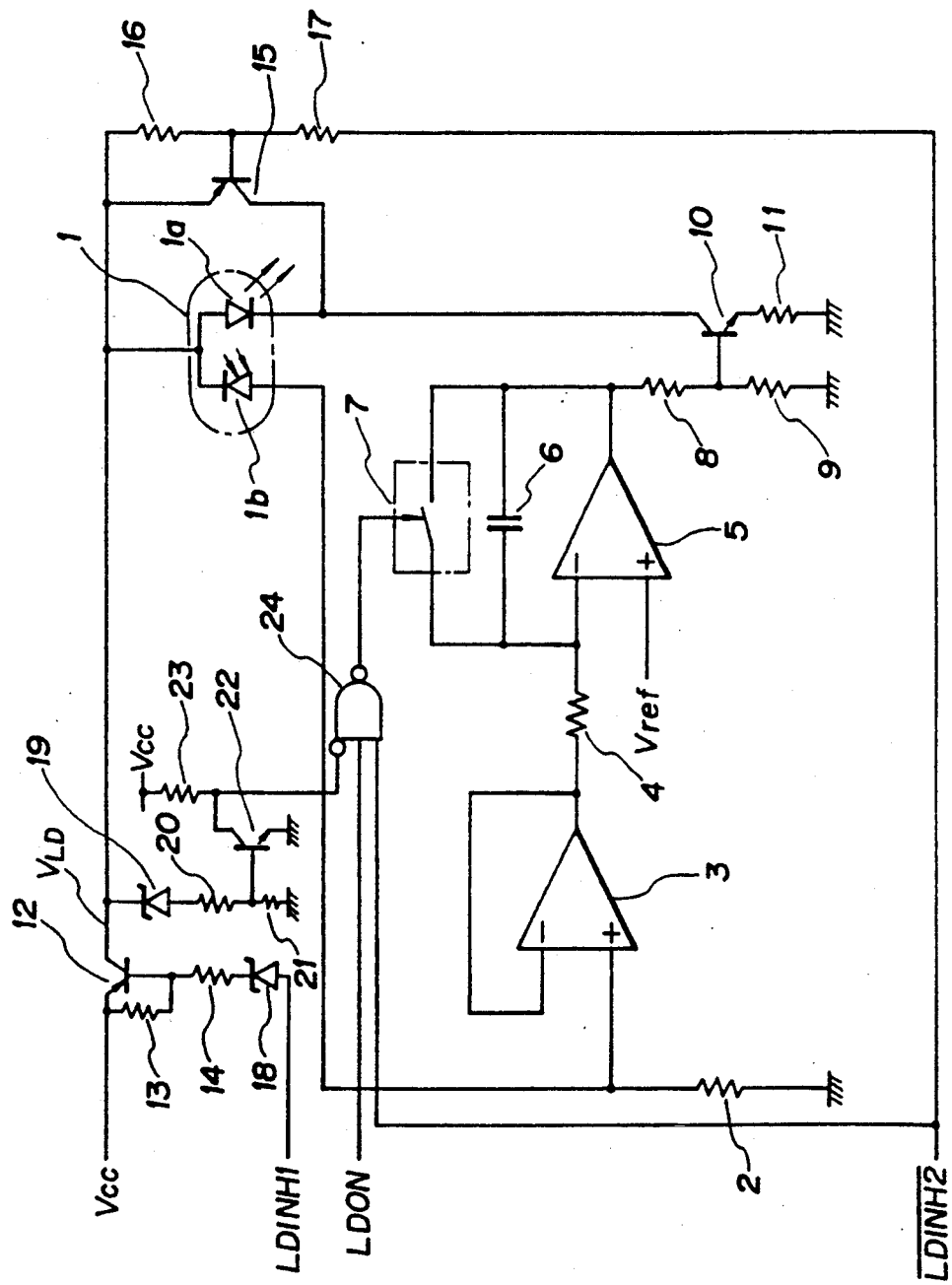

FIG. 25 shows another variation of the seventh embodiment of the inventive semiconductor laser driving circuit. In FIG. 25, the same component is denoted by the same reference numeral as in the FIG. 23 embodiment to facilitate the understanding of the present variation, which is added with a Zener diode 18. The diode 18 is connected through the resistor 14 to the base terminal of the blocking transistor 12. Further, a voltage detecting circuit is added to detect a voltage $V_{LD}$ applied to the anode terminal of the laser diode 1a. This detecting circuit is comprised of another Zener diode 19, a pair of bias resistors 20 and 21, a transistor 22 and a pullup resistor 23. The diode 19 has a cathode terminal connected to the anode of the laser diode 1a, and an anode terminal connected to a base terminal of the transistor 22 through the bias resistor 20. The transistor 22 has a collector terminal connected to the power source line V. . through the pullup resistor 23, and an emitter terminal grounded to the earth line. Further a three-input AND gate circuit 24 is added to receive, at its respective input terminals, an output voltage from the transistor 22, the start signal LDON, and the second inhibition signal LDINH2. The output of AND gate circuit 24 controls a conductive state of the analog switch 7.

Next, the description is given for the operation of these added components. Generally, the automatic laser power controlling circuit works in transition state during soft start operation in which the power source voltage V.. is relatively low. However, when the forward voltage is not sufficient for the laser diode, the integrating capacitor 6 is charged intensively through the automatic laser power control servo. Therefore, when the power source voltage V.. rises to a standing level, the laser diode may be destroyed due to excessive drive current. In order to avoid this, the Zener diode 18 is provided to place the transistor 12 in the nonconductive state when the power source voltage V.. is relatively low to effect inhibition of the laser emission as if the first inhibition signal LDINH1 is issued. Further, the detecting circuit 19-23 detects the voltage $V_{LD}$ applied to the anode terminal of the laser diode 1a. When the voltage $V_{LD}$ is relatively low, the Zener diode 19 functions to place the transistor 22 in the nonconductive state to output a stop signal at its collector terminal. The AND gate circuit 24 operates when receiving the stop signal to place the analog switch 7 in the conductive state so as to suspend the operation of the automatic laser power controlling circuit. These added components work in the same manner as when the inhibition is undertaken in response to the first inhibition signal LDINH1, thereby avoiding breakdown of the laser diode when releasing the inhibition of laser emission.

When the second inhibition signal LDINH2 is turned to the low level to make the transistor 15 conductive, the laser diode 1a is forcibly shut down. In such case, if the automatic laser power controlling circuit continued to work, the integrating capacitor 6 would be charged to increase the drive current flowing through the driving transistor 10. Further, when the second inhibition signal LDINH2 returns to the high level to release the inhibition of the laser emission, an excessive drive current would flow the laser diode to destroy the same. In order to prevent such possible destruction, when the second inhibition signal LDINH2 is held in the low level, the analog switch 7 is held conductive through the AND gate circuit 24 to stop the operation of the automatic laser power controlling circuit. As described, the added components in this variation constitute a protecting circuit effective to prevent destruction of the laser diode in the transition state.

Figure 26:
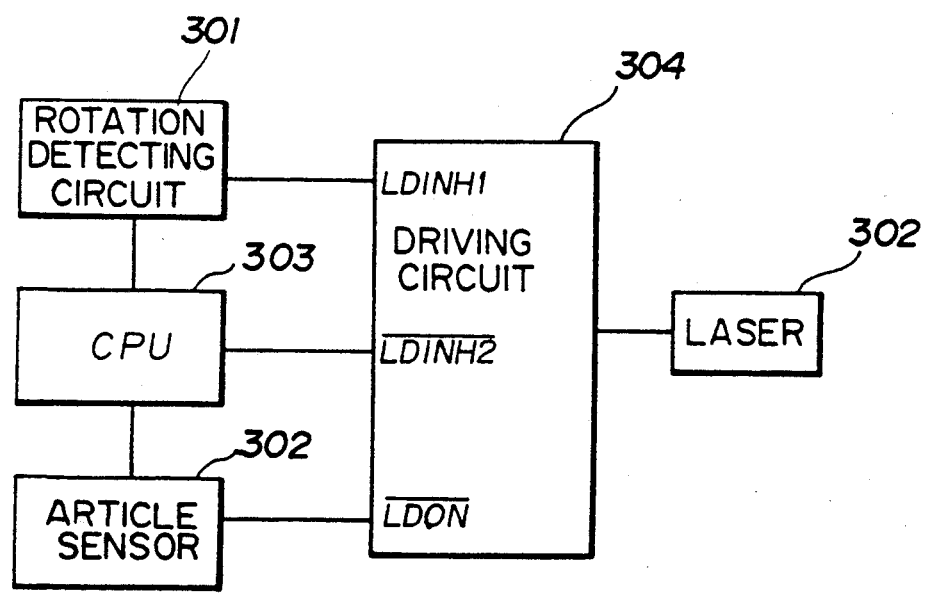
FIG. 26 is a schematic circuit block diagram of the bar code reader utilizing the seventh embodiment.

FIG. 26 is a schematic circuit block diagram of a bar code reader provided with the seventh embodiment of the semiconductor laser driving circuit. This circuit includes a scanning motor rotation detecting circuit 301 operative to produce a first inhibition signal LDINH1 when a scanning motor stops due to abnormality. Further, an article sensor 302 produces a start signal $\overline{\text{LDON}}$ when an article enters an irradiation zone of the laser beam. Further, a CPU 303 carries out controlling of the bar code reader and processing of data according to a given program, and produces a second inhibition signal LDINH2 when the CPU becomes out of control due to abnormality. A semiconductor laser driving circuit 304 responds to these start signal and inhibition signals to effect driving and shutdown of the laser source 302.

The semiconductor laser driving circuit 304 has a detailed circuit construction as shown in FIGS. 23, 24 or 25. In this embodiment, a pair of the inhibition signals are utilized; however, the invention is not limitative to this, but more than two inhibition signals may be utilized and the semiconductor laser driving circuit has correspondingly more than two inhibiting circuits independent from each other. A plurality of inhibition signals may be produced separately from each other due to different causes of failure, or they may be concurrently produced due to the same cause of failure. Further a plurality of the inhibition signals can be processed by the CPU 303 and then may be applied to the semiconductor laser driving circuit 304.

As described above, according to the seventh embodiment, in the semiconductor laser driving circuit having automatic laser power control mechanism, a plurality of inhibiting circuits are provided independently from each other. Therefore, even if a particular inhibiting circuit is broken down, the remaining inhibiting circuit effectively operates to ensure the safe performance of the laser diode.

What is claimed is:

1. A semiconductor laser driving circuit comprising: semiconductor laser means driven by a drive power for emitting a laser beam; photodetector means for effecting photoelectric conversion of the laser beam to output a corresponding electric signal; monitoring means for monitoring the electric signal to output a monitor signal indicative of variation in intensity of the laser beam; controlling means for comparing the monitor signal with a given reference signal to output a control signal according to difference therebetween; powering means operative according to the control signal to apply to the semiconductor laser means a drive power effective to null the difference; and abnormality detecting means for comparing the monitor signal with a given limit signal which is set different from the reference signal to output an abnormality signal indicative of the occurrence of abnormality.

2. A semiconductor laser driving circuit according to claim 1; including shutdown means responsive to the abnormality signal for shutting down the semiconductor laser means.

3. A semiconductor laser driving circuit according to claim 1; wherein the abnormality detecting means includes means operative when the monitor signal falls below a given lower limit signal which is set lower than the reference signal for outputting an abnormality signal indicative of abnormal output reduction in either of the semiconductor laser means and the photodetector means.

4. A semiconductor laser driving circuit according to claim 1; wherein the abnormality detecting means includes means operative when the semiconductor laser means is started for temporarily inhibiting operation of the abnormality detecting circuit.

5. A semiconductor laser driving circuit according to claim 1; including setting means for setting an upper limit signal greater than the reference signal and smaller than a signal level which cannot be exceeded by the monitor signal during normal operation, and wherein the abnormality detecting means includes means for comparing the monitor signal with the upper limit signal to detect abnormality to output an abnormality signal.

6. A semiconductor laser driving circuit according to claim 5; wherein the abnormality detecting means includes comparing means operative when the monitor signal exceeds the upper limit signal to output an inversion signal, and latching means for latching the inversion signal to continuously produce the abnormality signal.

7. A semiconductor laser driving means according to claim 5; including checking circuit operable during the normal operation of the semiconductor laser means for temporarily lowering a level of the upper limit signal below the reference signal to enable the abnormality detecting means to produce intentionally an abnormality signal to thereby check operation of the abnormality detecting means.

8. A semiconductor laser driving circuit according to claim 7; wherein the checking means includes switching means responsive to a check signal to shift the level of the upper limit signal below the reference signal, and resetting means responsive to removal of the check signal to reset the latching means to erase the intentionally produced abnormality signal.

9. A semiconductor laser driving circuit according to claim 1; wherein the monitoring means has a first detecting resistor for detecting the electric signal so as to produce a first monitor signal indicative of variation in intensity of the laser beam according to detection result and a second detecting resistor connected to the first detecting resistor for separately detecting the same electric signal to output a second monitor signal correlated to the first monitor signal according to detection result, the controlling means has means for comparing the first monitor signal with a given reference signal to output a control signal according to difference therebetween, and the abnormality detecting means has means for comparing the second monitor signal with a given limit signal which is set different from the reference signal to detect abnormality to output an abnormality signal.

10. A semiconductor laser driving circuit according to claim 9; wherein the abnormality detecting means includes means operative when the second monitor signal falls below a given lower limit signal which is set lower than the reference signal or when the second monitor signal exceeds a given upper limit signal which is set higher than the reference signal for outputting an abnormality signal.

11. A semiconductor laser driving circuit according to claim 9; wherein the monitoring means includes a pair of first and second detecting resistors connected in series to one another for detecting the electric signal, first means for forming a first monitor signal according to a potential difference developed across the first detecting resistor, and second means for forming a second monitor signal according to a potential difference developed across the second detecting resistor.

12. A semiconductor laser driving circuit according to claim 11; wherein the first means includes first regulating means for regulating a level of the first monitor signal to adjust the drive power, and the second means includes second regulating means for regulating a level of the second monitor signal according to the regulated reference signal.

13. A semiconductor laser driving circuit according to claim 1; including lifetime detecting means responsive to a start signal of the semiconductor laser means for detecting a rising time of the monitor signal so as to produce an alarm signal according to a delay amount of the detected rising time, and displaying means for displaying a degradation degree of the semiconductor laser means in response to the alarm signal.

14. A semiconductor laser driving circuit according to claim 13; wherein the lifetime detecting means includes a plurality of delaying circuits for stepwise measuring the delay amount.

15. A semiconductor laser driving circuit according to claim 13; wherein the lifetime detecting means includes a comparator for detecting the rising time of the monitor signal when the monitor signal exceeds a given lower limit signal which is set lower than the reference signal.

16. A semiconductor laser driving circuit according to claim 1; including setting means for setting a threshold voltage between a stable level and a critical level of an output voltage of the control signal, lifetime detecting means for comparing the output voltage with the threshold voltage to produce an alarm signal when the output voltage exceeds the threshold voltage to approach the critical voltage, and displaying means for displaying an end of lifetime of the semiconductor laser means in response to the alarm signal.

17. A semiconductor laser driving circuit according to claim 16; wherein the setting means has means for setting a threshold voltage stepwise at different levels, and the lifetime detecting means has means for sequentially producing a different alarm signal according to a different level of the threshold voltage.

18. A semiconductor laser driving circuit according to claim 16; wherein the abnormality detecting means has means for comparing the monitor signal with a lower limit signal set lower than the reference signal to control the displaying means to display abnormality that the lifetime of the semiconductor laser is over when the monitor signal falls below the lower limit signal.

19. A semiconductor laser driving circuit according to claim 1; including an inhibiting means responsive to an external inhibition signal for inhibiting supply of the drive power to the semiconductor laser means to effect shutdown of the semiconductor laser means, and another inhibiting means operative independently from the first-mentioned inhibiting means and responsive to an external inhibition signal for inhibiting supply of the drive power to the semiconductor laser means to effect shutdown of the semiconductor laser means.

20. A semiconductor laser driving circuit according to claim 19; comprising an inhibiting means responsive to an inhibition signal for blocking the supply of the drive power to the semiconductor laser means, and another inhibiting means responsive to an inhibition signal for bypassing the drive power away from the semiconductor laser means.

21. A semiconductor laser driving circuit according to claim 19; including protecting means responsive to the inhibition signal for stopping operation of the controlling means.

22. A semiconductor laser driving circuit comprising: semiconductor laser means; current supply means responsive to a start signal for supply a drive current to the semiconductor laser means to effect laser emission; an inhibiting means responsive to an inhibition signal for inhibiting the supply of the drive current to the semiconductor laser means to effect shutdown of the laser emission; and another inhibiting means operative independently from the first-mentioned inhibiting means and responsive to an inhibition signal for inhibiting the supply of the drive current to the semiconductor laser means to effect shutdown of the laser emission.

23. A semiconductor laser driving circuit according to claim 22; comprising an inhibiting means responsive to an inhibition signal for blocking the supply of the drive current to the semiconductor laser means, and another inhibiting means responsive to an inhibition signal for bypassing the drive current away from the semiconductor laser means.

24. A semiconductor laser driving circuit according to claim 22; wherein the current supplying means comprises automatic laser power controlling means for automatically controlling the supply of the drive current so as to maintain a constant laser emission, and protecting means responsive to the inhibition signal for stopping operation of the automatic laser power controlling means.

25. A semiconductor laser driving circuit for use in a bar code reader, comprising: semiconductor laser means provided for irradiating a laser beam so as to read a bar code fixed on an article; article detecting means for detecting an article to produce a start signal; current supplying means responsive to the start signal for supplying a drive current to the semiconductor laser means to effect the irradiation of the laser beam; emergency detecting means for detecting emergency to produce an inhibition signal; an inhibiting means responsive to the inhibition signal for inhibiting the supply of the drive current to the semiconductor laser means to carry out shutdown of the semiconductor laser means; and another inhibiting means operative independently from the first-mentioned inhibiting means and responsive to the inhibition signal for inhibiting the supply of the drive current to the semiconductor laser means to carry out the shutdown.

* * * * *